US011342364B2

(12) United States Patent
Tanaka et al.

(10) Patent No.: US 11,342,364 B2
(45) Date of Patent: May 24, 2022

(54) THIN-FILM TRANSISTOR SUBSTRATE

(71) Applicant: Tianma Japan, Ltd., Kanagawa (JP)

(72) Inventors: Jun Tanaka, Kanagawa (JP);
Kazushige Takechi, Kanagawa (JP)

(73) Assignees: TIANMA JAPAN. LTD., Kanagawa
(JP); **Wuhan Tianma
Micro-Electronics Co., Ltd.**, Wuhan
(CN)

( * ) Notice: Subject to any disclaimer, the term of this patent is extended or adjusted under 35 U.S.C. 154(b) by 0 days.

(21) Appl. No.: 16/925,477

(22) Filed: Jul. 10, 2020

(65) Prior Publication Data
US 2021/0013245 A1    Jan. 14, 2021

(30) Foreign Application Priority Data

Jul. 11, 2019 (JP) .............................. JP2019-128954
Mar. 25, 2020 (JP) .............................. JP2020-055139

(51) Int. Cl.
*H01L 27/00*    (2006.01)
*H01L 29/00*    (2006.01)
*H01L 27/12*    (2006.01)
*H01L 27/02*    (2006.01)
*H01L 29/786*   (2006.01)

(52) U.S. Cl.
CPC ...... *H01L 27/1251* (2013.01); *H01L 27/0266* (2013.01); *H01L 27/127* (2013.01); *H01L 27/1225* (2013.01); *H01L 29/78696* (2013.01)

(58) Field of Classification Search
CPC ............. H01L 27/1225; H01L 27/1251; H01L 27/0266; H01L 27/1237; H01L 27/1248; H01L 27/127; H01L 27/1255; H01L 27/0296; H01L 29/78696; H01L 29/7669; H01L 29/24; H01L 29/78648; H01L 29/78693; H01L 29/41733; H01L 27/1218; H01L 29/66969; H01L 29/7869; H01L 29/78633
See application file for complete search history.

(56) References Cited

U.S. PATENT DOCUMENTS

| | | | |
|---|---|---|---|
| 9,472,559 B2 * | 10/2016 | Shionoiri | ............ H01L 27/1251 |
| 9,847,358 B2 * | 12/2017 | Koezuka | ............ H01L 27/1237 |
| 2011/0156025 A1 * | 6/2011 | Shionoiri | ............ H01L 27/1255 257/43 |
| 2017/0053950 A1 * | 2/2017 | Koezuka | ........... H01L 29/78645 |
| 2017/0184893 A1 | 6/2017 | Saitoh et al. | |

* cited by examiner

*Primary Examiner* — Nikolay K Yushin
(74) *Attorney, Agent, or Firm* — Sughrue Mion, PLLC

(57) ABSTRACT

A thin-film transistor substrate includes an insulating substrate, a first insulating layer, a first thin-film transistor including a first oxide semiconductor film, a second insulating layer located upper than the first insulating layer, and a second thin-film transistor including a second oxide semiconductor film different in composition from the first oxide semiconductor film. At least a part of the first oxide semiconductor film is provided above and in contact with the first insulating layer. The first insulating layer is the uppermost insulating layer among insulating layers located lower than and in contact with the first oxide semiconductor film. At least a part of the second oxide semiconductor film is provided above and in contact with the second insulating layer. The second insulating layer is the uppermost insulating layer among insulating layers located lower than and in contact with the second oxide semiconductor film.

17 Claims, 34 Drawing Sheets

THIN-FILM TRANSISTOR SUBSTRATE

CROSS-REFERENCE TO RELATED APPLICATIONS

This non-provisional application claims priority under 35 U.S.C. § 119(a) on Patent Application No. 2019-128954 filed in Japan on Jul. 11, 2019 and Patent Application No. 2020-55139 filed in Japan on Mar. 25, 2020, the entire contents of which are hereby incorporated by reference.

BACKGROUND

This disclosure relates to a thin-film transistor substrate.

Thin-film transistors (TFTs) including an oxide semiconductor material such as indium-gallium-zinc-oxide (IGZO) are used in display devices including liquid crystal display panels and organic light-emitting diode (OLED) display devices and other kinds of devices. An oxide semiconductor TFT generates small leakage current and therefore, contributes to low power consumption of the device. However, the oxide semiconductor TFT has low mobility compared to a low-temperature polysilicon TFT. To address this issue, US 2017/0184893 A discloses a display device that has achieved both low power consumption and a slim bezel by including oxide semiconductor TFTs having different mobilities.

SUMMARY

An aspect of this disclosure is a thin-film transistor substrate including: an insulating substrate; a first insulating layer provided on the insulating substrate; a first thin-film transistor provided on the insulating substrate and including a first oxide semiconductor film; a second insulating layer provided on the insulating substrate and being located upper than the first insulating layer; and a second thin-film transistor provided on the insulating substrate and including a second oxide semiconductor film different in composition from the first oxide semiconductor film. At least a part of the first oxide semiconductor film is provided above and in contact with the first insulating layer. The first insulating layer is the uppermost insulating layer among insulating layers located lower than and in contact with the first oxide semiconductor film. At least a part of the second oxide semiconductor film is provided above and in contact with the second insulating layer. The second insulating layer is the uppermost insulating layer among insulating layers located lower than and in contact with the second oxide semiconductor film.

Another aspect of this disclosure is a method of manufacturing a thin-film transistor substrate, the method including: forming a first insulating layer on an insulating substrate; forming a first oxide semiconductor layer including a channel region of a first thin-film transistor after forming the first insulating layer; forming a second insulating layer to cover the first oxide semiconductor layer; and forming a second oxide semiconductor film including a channel region of a second thin-film transistor in a state where the first oxide semiconductor layer is covered with the second insulating layer.

It is to be understood that both the foregoing general description and the following detailed description are exemplary and explanatory and are not restrictive of this disclosure.

EMBODIMENTS

Figure 1:
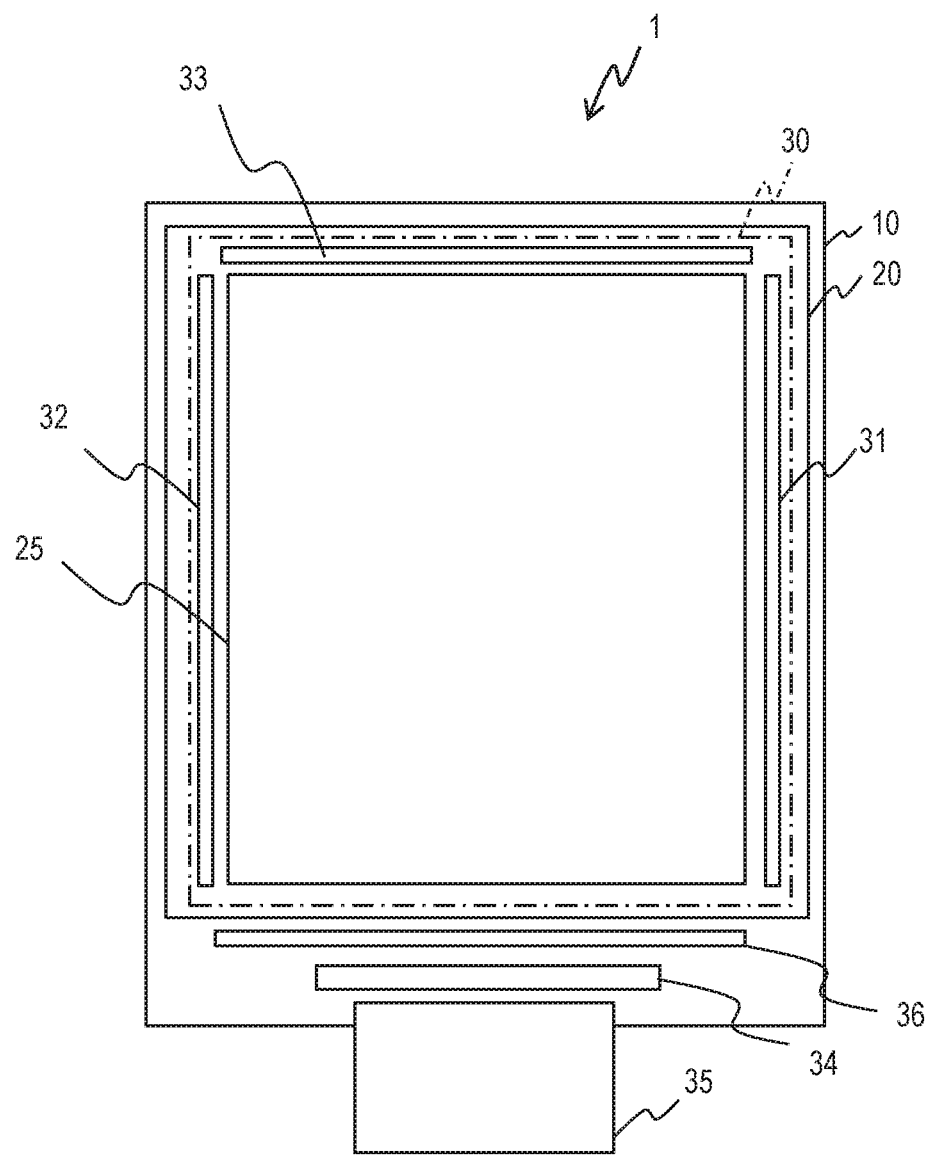
FIG. 1 schematically illustrates a configuration example of a liquid crystal display panel.

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs and some elements in the drawings are exaggerated in size or shape for clear understanding of description.

Overview

Hereinafter, configurations and methods of manufacturing the TFT substrate including oxide semiconductor TFTs of this disclosure are described. The TFT substrate of this disclosure can be used in various devices such as sensor devices and display devices.

There are various demands to a device, such as a demand for lower power consumption, a demand for smaller circuit size, and a demand for higher reliability. To satisfy such different demands with oxide semiconductor TFTs, it is necessary to fabricate oxide semiconductor TFTs including oxide semiconductor films having different characteristics (made of different materials) on the same substrate. To meet the various demands appropriately, it is important that the oxide semiconductor material for each oxide semiconductor TFT be selectable from various oxide semiconductor materials.

The TFT substrate of this disclosure includes oxide semiconductor TFTs including oxide semiconductor films made of different materials (having different elemental compositions). The different materials satisfy the different demands to the TFT substrate. At least a part of the oxide semiconductor film of a first kind of oxide semiconductor TFT is provided above and in contact with a first insulating layer and at least a part of the oxide semiconductor film of a second kind of oxide semiconductor TFT is provided above and in contact with a second insulating layer different from the first insulating layer. This configuration allows selection of different oxide semiconductor materials for the TFTs from various oxide semiconductor materials.

Oxide semiconductor TFTs exhibit low leakage current and low temperature dependency but have low mobility and low reliability, compared to low-temperature polysilicon TFTs. Particularly, oxide semiconductor TFTs have low negative bias illumination temperature stress (NBITS) reliability. The NBITS reliability is the reliability when the TFT is placed under the stress conditions of negative gate bias, light, and high temperature. The gate threshold voltage of an oxide semiconductor TFT could significantly change with NBITS.

It is considered that the change of the gate threshold voltage is caused by the carriers generated by light. Accordingly, to increase the reliability of an oxide semiconductor TFT, employing an oxide semiconductor material having a wide bandgap is important. On the other hand, to achieve a smaller circuit size, the mobility of the oxide semiconductor TFTs therein should be high, that is, employing an oxide semiconductor material having high mobility is important.

For a display device to attain a slim bezel and high reliability, for example, the TFT substrate can include oxide semiconductor TFTs employing an oxide semiconductor material having high mobility in the peripheral circuits and oxide semiconductor TFTs employing an oxide semiconductor material having a wide bandgap in the display region (pixel circuits). Hereinafter, TFT substrates for a display device are described as examples of application of the TFT substrate of this disclosure.

Embodiment 1

Configuration of Display Device

FIG. 1 illustrates a configuration example of a liquid crystal display panel 1. The liquid crystal display panel 1 includes a thin-film transistor (TFT) substrate 10 on which TFTs and pixel electrodes for applying electric fields to liquid crystal are provided, an opposite substrate 20, and a sealer 30 for bonding the TFT substrate 10 with the opposite substrate 20. Liquid crystal material is enclosed between the TFT substrate 10 and the opposite substrate 20. A common electrode for generating electric fields to be applied to the liquid crystal with the pixel electrodes is provided on the TFT substrate 10 or the opposite substrate 20.

On the faces of the TFT substrate 10 and the opposite substrate 20 facing each other, alignment films (not-shown) for initially aligning the liquid crystal are provided. On the other outer faces of the TFT substrate 10 and the opposite substrate 20, polarizing plates (not shown) are provided. A liquid crystal display panel further includes a not-shown backlight unit.

In the periphery outer than the display region 25 of the TFT substrate 10, peripheral circuits are provided. The region outer than the display region 25 where the peripheral circuits are provided is referred to as peripheral circuit region. Examples of the peripheral circuits include a first scanning driver 31, a second scanning driver 32, a protection circuit 33, and a demultiplexer 36. Furthermore, a driver IC 34 is provided outside the display region 25.

The protection circuit 33 includes an electrostatic discharge (ESD) protection element and saves the elements in the pixel circuits from ESD damage. The driver IC 34 is connected to the external devices via flexible printed circuits (FPC) 35. The driver IC 34 is mounted with an anisotropic conductive film (ACF), for example.

The scanning drivers 31 and 32 drive scanning lines on the TFT substrate 10. The driver IC 34 supplies power and timing signals (control signals) to the scanning drivers 31 and 32 and further, supplies a signal corresponding to video data to data lines through the demultiplexer 36. The demultiplexer 36 outputs output of one pin of the driver IC 34 to d data lines in series (d is an integer more than 1). The demultiplexer 36 changes the output data line for the data signal from the driver IC 34 d times per scanning period to drive d times as many data lines as output pins of the driver IC 34.

Organic light-emitting diode (OLED) display devices have a configuration similar to the configuration illustrated in FIG. 1. An OLED display device includes a TFT substrate on which organic light-emitting elements (OLED elements) and TFTs are provided, an encapsulation substrate for encapsulating the OLED elements, and a bond (glass frit sealer) for bonding the TFT substrate with the encapsulation substrate. The space between the TFT substrate and the encapsulation substrate is filled with dry nitrogen, for example, and sealed up with the bond. The encapsulation substrate and the bond constitute a structural encapsulation unit. The structural encapsulation unit can have a thin film encapsulation (TFE) structure.

In the periphery outer than the display region of the TFT substrate, one or more scanning drivers, a protection circuit, a driver IC, and a demultiplexer are provided. The scanning drivers and the protection circuit are peripheral circuits provided on the TFT substrate. For example, the first scanning driver drives scanning lines on the TFT substrate; the second scanning driver drives control lines to control light-emitting periods of pixels and supply a reference potential to the pixels. The driver IC provides power and timing signals (control signals) to the scanning drivers and further, provides power and a data signal to the demultiplexer. The demultiplexer has the same function as the demultiplexer 36 in the liquid crystal display panel 1.

Configuration of TFT Substrate

Figure 2:
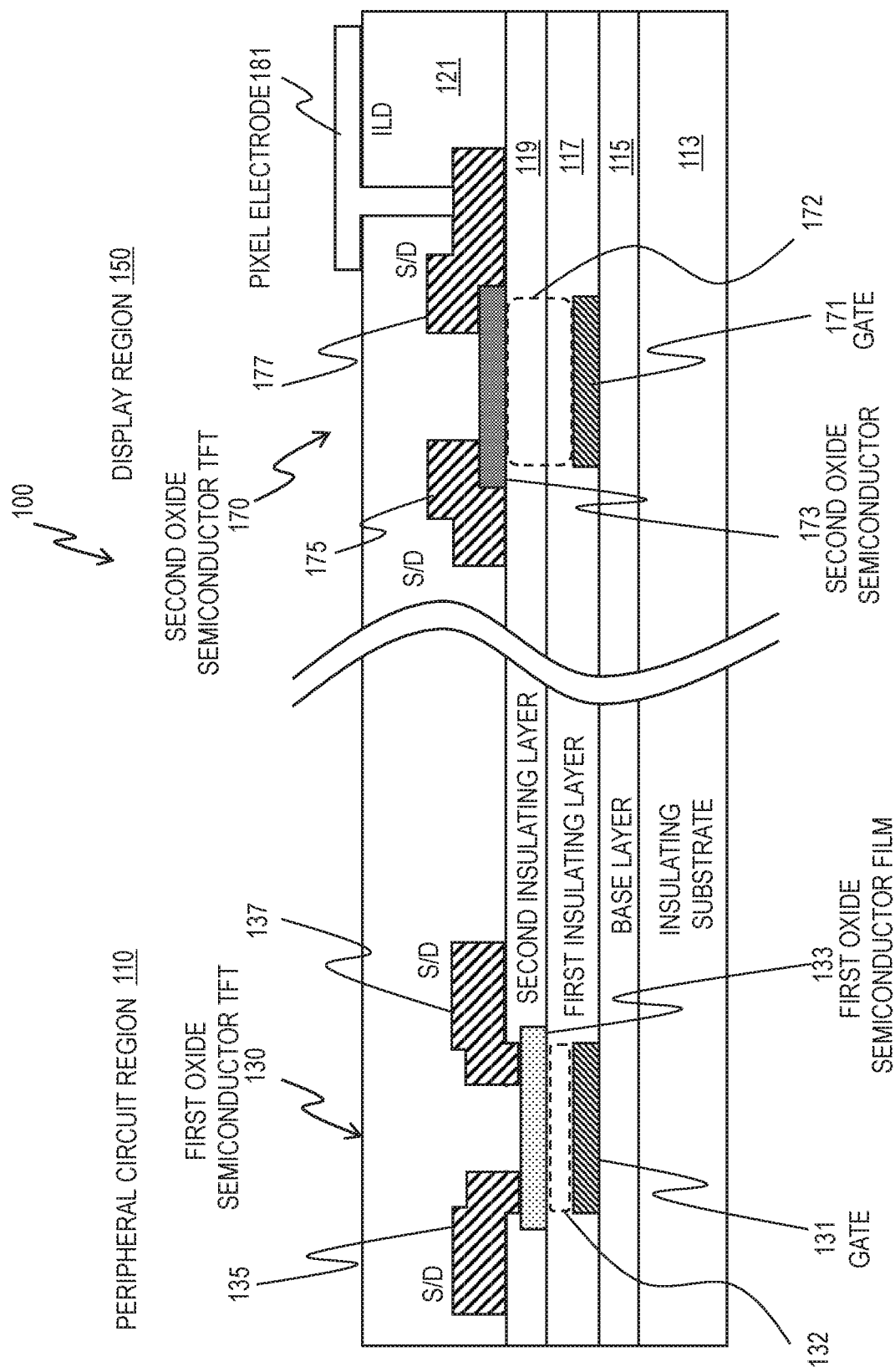
FIG. 2 schematically illustrates a cross-section of a configuration example of a TFT substrate for a liquid crystal display panel.

FIG. 2 schematically illustrates a cross-section of a configuration example of a TFT substrate 100 for a liquid crystal display panel. FIG. 2 illustrates one first oxide semiconductor TFT 130 in a peripheral circuit region 110 of the TFT substrate 100 and one second oxide semiconductor TFT 170 in a display region 150 of the TFT substrate 100 by way of example. The peripheral circuit region 110 is located outer than the display region 150 and is a region to mount peripheral circuits. The display region 150 is a region including pixels. For example, the first oxide semiconductor TFT 130 is an oxide semiconductor TFT in a scanning driver and the second oxide semiconductor TFT 170 is a switching TFT for selecting a pixel to supply a data signal.

The first oxide semiconductor TFT 130 and the second oxide semiconductor TFT 170 are fabricated on a flexible or inflexible insulating substrate 113 made of resin or glass. In the following description, the layer closer to the insulating substrate 113 between two laminated layers in contact with each other (two layers having an interface) is a lower layer and the layer farther from the insulating substrate 113 is an upper layer.

The oxide semiconductor film (first oxide semiconductor film) 133 of the first oxide semiconductor TFT 130 and the oxide semiconductor film (second oxide semiconductor film) 173 of the second oxide semiconductor TFT 170 are made of different oxide semiconductor materials and have different characteristics. In this example, the mobility of the first oxide semiconductor film 133 is higher than the mobility of the second oxide semiconductor film 173 and the bandgap of the second oxide semiconductor film 173 is wider than the bandgap of the first oxide semiconductor film 133. Because of the difference in characteristics between two oxide semiconductor films, a slim bezel and high reliability are both achieved.

Examples of the oxide semiconductor material that can be used for the first oxide semiconductor film 133 include ITZO, IGZTO, In—Zn—Ti—O, and In—W—Z—O. Examples of the oxide semiconductor material that can be used for the second oxide semiconductor film 173 include IGZO, GaZnO, and IGO.

The oxide semiconductor film (first oxide semiconductor film) 133 of the first oxide semiconductor TFT 130 is provided above and in contact with a first insulating layer 117. The oxide semiconductor film (second oxide semiconductor film) 173 of the first oxide semiconductor TFT 170 is provided above and in contact with a second insulating layer 119. The second insulating layer 119 is located upper than the first insulating layer 117. The first oxide semiconductor film 133 is located lower than the second oxide semiconductor film 173. The first insulating layer 117 and the second insulating layer 119 can be made of silicon nitride or silicon oxide.

In the configuration example in FIG. 2, the entire first oxide semiconductor film 133 is provided above and in contact with the first insulating layer 117 and the entire second oxide semiconductor film 173 is provided above and in contact with the second insulating layer 119. The second insulating layer 119 is provided above and in contact with the first insulating layer 117. The first oxide semiconductor film 133 and the second insulating layer 119 are both provided above and in contact with the first insulating layer 117.

The first oxide semiconductor TFT 130 includes the first oxide semiconductor film 133, a gate electrode 131 located lower than the first oxide semiconductor film 133, and a gate insulating film 132 located between the gate electrode 131 and the first oxide semiconductor film 133 in the layering direction. The gate electrode 131 is provided above and in contact with an insulative base layer 115. The gate insulating film 132 is a part of the first insulating layer 117. The base layer 115 can be made of silicon nitride or silicon oxide.

The first oxide semiconductor film 133 includes two source/drain regions (not shown) and a channel region (not shown) between the source/drain regions. The source/drain regions are low-resistive regions and the channel region is a highly-resistive region. The source/drain regions are parts in contact with source/drain electrodes 135 and 137. The source/drain electrodes 135 and 137 are provided above and in contact with the second insulating layer 119 and they are in contact with the top face of the first oxide semiconductor film 133 within an opening formed in the second insulating layer 119. Although the source/drain electrodes 135 and 137 in the example of FIG. 2 are in contact with only the top face of the first oxide semiconductor film 133, the source/drain electrodes 135 and 137 can be in contact with an end face and the top face of the first oxide semiconductor film 133.

The second oxide semiconductor TFT 170 includes the second oxide semiconductor film 173, a gate electrode 171 located lower than the second oxide semiconductor film 173, and a gate insulating film 172 located between the gate electrode 171 and the second oxide semiconductor film 173 in the layering direction. The gate electrode 171 is provided above and in contact with the insulative base layer 115. The gate insulating film 172 has a laminate structure consisting of a part of the first insulating layer 117 and a part of the second insulating layer 119. The gate insulating film 172 of the second oxide semiconductor TFT 170 is thicker than the gate insulating film 132 of the first oxide semiconductor TFT 130 to increase the reliability of the gate insulating film 172 of the second oxide semiconductor TFT 170.

The second oxide semiconductor TFT 173 includes two source/drain regions (not shown) and a channel region (not shown) between the source/drain regions. The source/drain regions are parts in contact with source/drain electrodes 175 and 177. The source/drain electrodes 175 and 177 are provided above and in contact with the second insulating layer 119. The source/drain electrodes 175 and 177 are in contact with the parts of the second oxide semiconductor film 173 including either end thereof.

The first oxide semiconductor film 133 and the second oxide semiconductor film 173 are covered with an interlayer dielectric (ILD) layer or interlayer insulating layer 121. The interlayer insulating layer 121 can be made of inorganic or organic material. A pixel electrode 181 is provided above and in contact with the interlayer insulating layer 121 and connected with the source/drain electrode 177 of the second oxide semiconductor TFT 170 through a via provided in a via hole in the interlayer insulating layer 121. The pixel electrode 181 can be made of indium tin oxide (ITO).

The insulative base layer 115 is provided above and in contact with the insulating substrate 113; the two gate electrodes 131, 171 and the first insulating layer 117 are provided above and in contact with the base layer 115. The gate electrodes 131 and 171 are parts included in the same metal layer. The material for the gate electrodes 131 and 171 can be selected desirably; the gate electrodes 131 and 171 can be a single layer of Mo, W, Nb, Al, Ta, Cr, Ti, a laminate of metals selected from these, or an alloy of a metal selected from these. The gate electrodes 131 and 171 are fully covered with the first insulating layer 117.

The source/drain electrodes 135, 137, 175, and 177 of the first oxide semiconductor TFT 130 and the second oxide semiconductor TFT 170 are parts included in the same metal layer. The source/drain electrodes 135, 137, 175, and 177 can be prepared by depositing and patterning conductive films of Ti/Al/Ti or Mo/Al/Mo. The source/drain electrodes 135, 137, 175, and 177 can have a single layer structure or be made of metals different from these metals.

Method of Manufacturing TFT Substrate

Figure 3A:
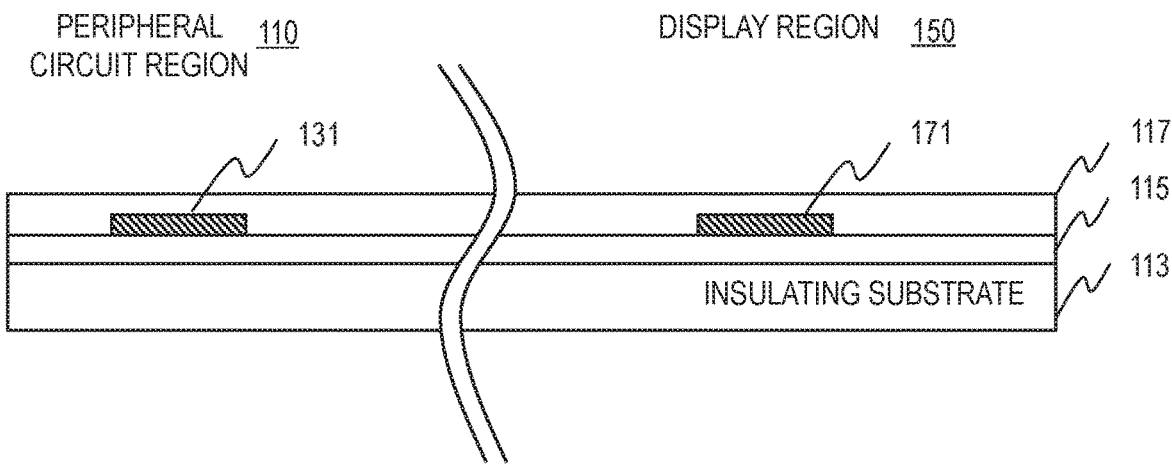
FIG. 3A illustrates a step of a method of manufacturing the TFT substrate illustrated in FIG. 2.

An example of a method of manufacturing the TFT substrate 100 illustrated in FIG. 2 is described. As illustrated in FIG. 3A, the method of manufacturing the TFT substrate 100 forms a base layer 115 of about 100 nm in thickness by CVD on an insulating substrate 113. Next, the method forms a metal layer (gate electrode layer) including gate electrodes 131 and 171 on the base layer 115. Specifically, the method forms a metal film of about 300 nm in thickness by sputtering and patterns the metal film by photolithography and etching. Further, the method forms a first insulating layer 117 of about 300 nm in thickness by CVD to cover the gate electrode layer.

Figure 3B:
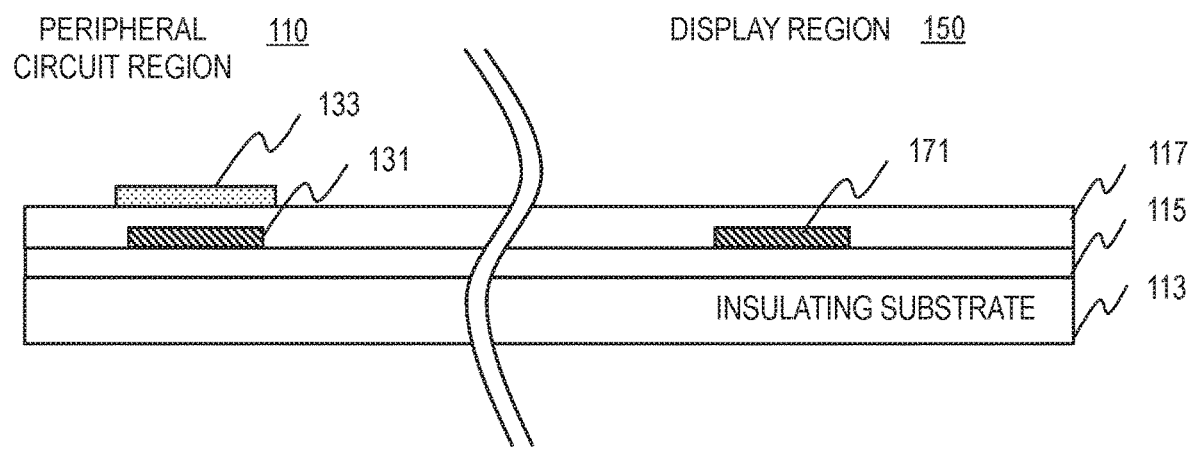
FIG. 3B illustrates a step of a method of manufacturing the TFT substrate illustrated in FIG. 2.

Next, the method forms an oxide semiconductor layer (first oxide semiconductor layer) including a first oxide semiconductor film 133 on the first insulating layer 117 as illustrated in FIG. 3B. Specifically, the method forms an oxide semiconductor layer of about 50 nm in thickness by sputtering and patterns the oxide semiconductor layer by photolithography and etching. As a result, a pattern of the oxide semiconductor film is formed.

Figure 3C:
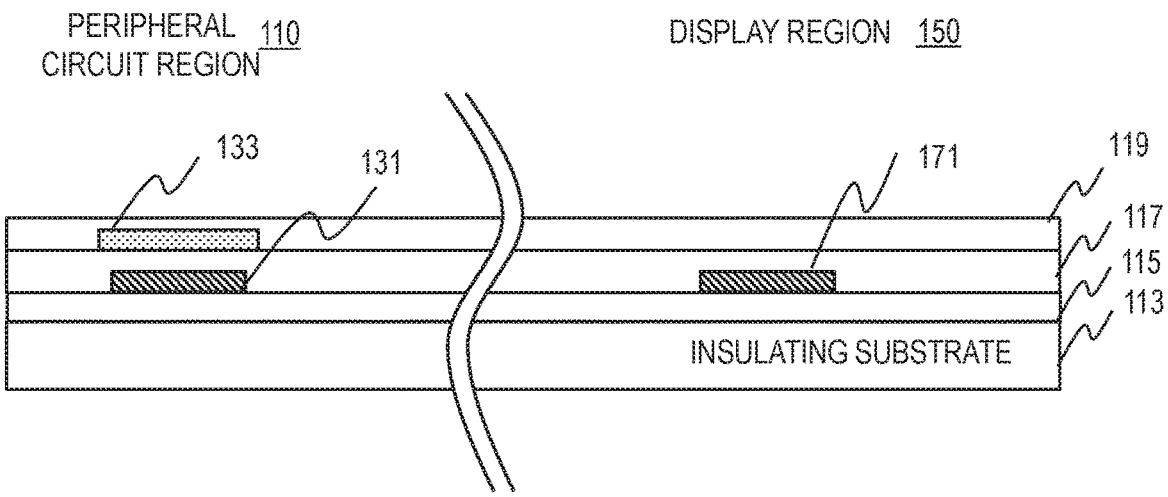
FIG. 3C illustrates a step of a method of manufacturing the TFT substrate illustrated in FIG. 2.
Figure 3D:
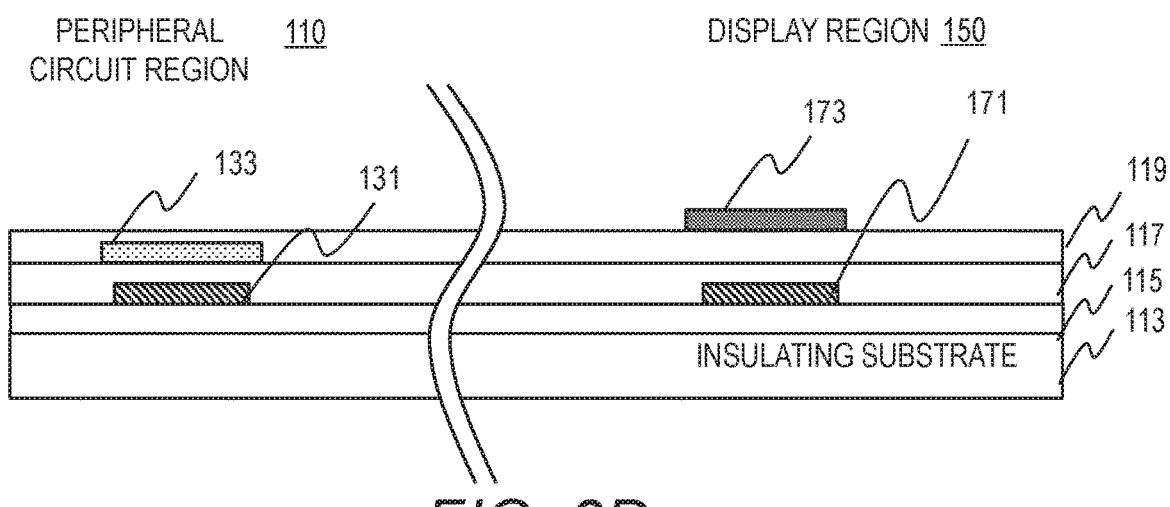
FIG. 3D illustrates a step of a method of manufacturing the TFT substrate illustrated in FIG. 2.

Next, the method forms a second insulating layer 119 of about 100 nm in thickness by CVD to cover the first oxide semiconductor film 133 as illustrated in FIG. 3C. Next, the method forms an oxide semiconductor layer (second oxide semiconductor layer) including a second oxide semiconductor film 173 on the second insulating layer 119 as illustrated in FIG. 3D. Specifically, the method forms an oxide semiconductor layer of about 50 nm in thickness by sputtering and patterns the oxide semiconductor layer by photolithography and etching. As a result, a pattern of the oxide semiconductor film is formed.

Figure 3E:
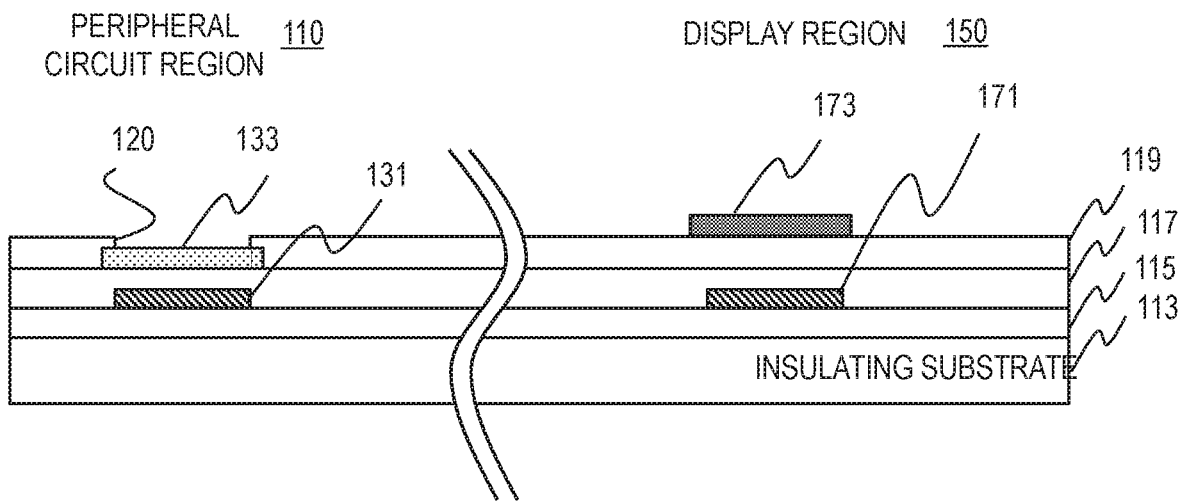
FIG. 3E illustrates a step of a method of manufacturing the TFT substrate illustrated in FIG. 2.

Next, the method opens an opening 120 in the second insulating layer 119 by photolithography and etching as illustrated in FIG. 3E. The opening 120 is formed to expose the top face of the first oxide semiconductor film 133 in the opening. Although the end faces of the first oxide semiconductor film 133 are not exposed in the opening 120 in this example, they can be exposed.

Figure 3F:
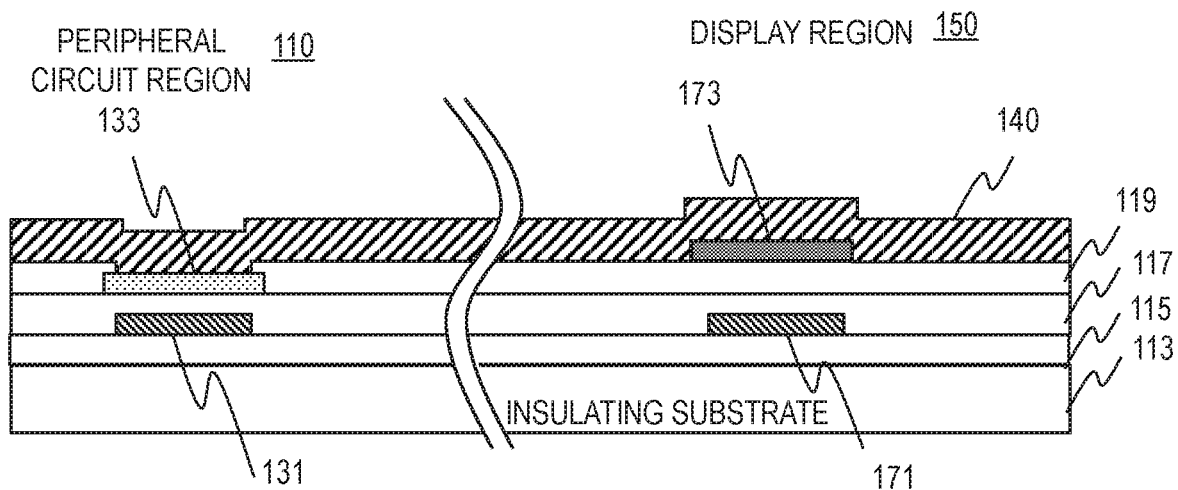
FIG. 3F illustrates a step of a method of manufacturing the TFT substrate illustrated in FIG. 2.
Figure 3G:
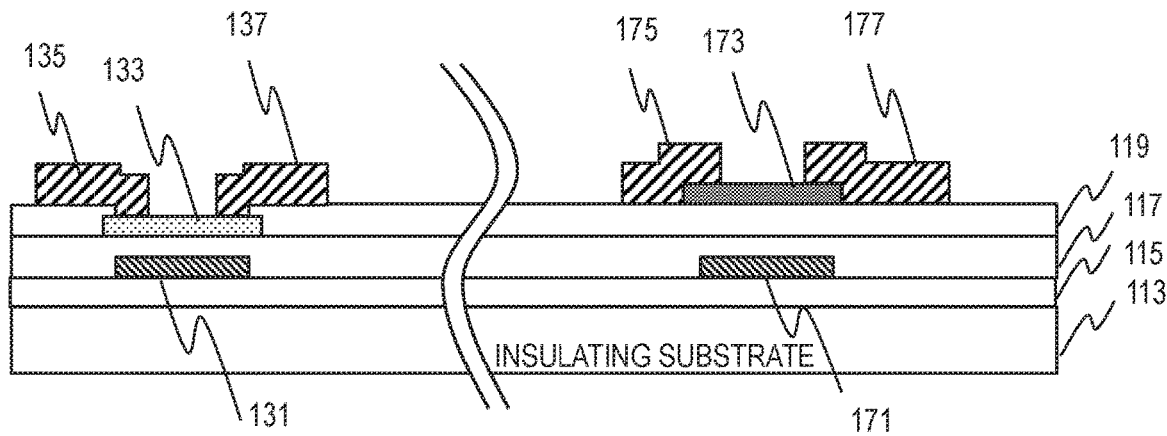
FIG. 3G illustrates a step of a method of manufacturing the TFT substrate illustrated in FIG. 2.

Next, the method forms a metal layer (source/drain electrode layer) 140 of about 300 nm in thickness by sputtering as illustrated in FIG. 3F. This metal layer 140 includes source/drain electrodes 135, 137, 175, and 177 and covers the second insulating layer 119, the first oxide semiconductor film 133, and the second oxide semiconductor film 173. The metal layer 140 fills the opening 120 provided in the second insulating layer 119 and contacts the top face of the first oxide semiconductor film 133. Next, the method patterns the metal layer 140 by photolithography and etching to form the source/drain electrodes 135, 137, 175, and 177 as illustrated in FIG. 3G.

Figure 3H:
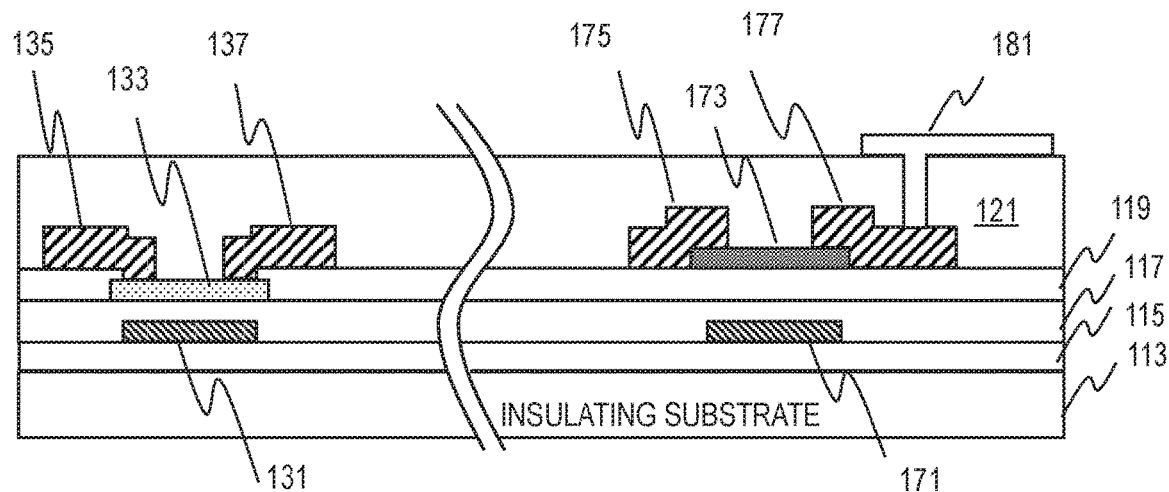
FIG. 3H illustrates a step of a method of manufacturing the TFT substrate illustrated in FIG. 2.

Next, the method forms an interlayer insulating layer 121 of about 400 nm in thickness by CVD to cover the source/drain electrodes 135, 137, 175, 177, the first oxide semiconductor film 133, and the second oxide semiconductor film 173, and opens a via hole in the interlayer insulating layer 121 by photolithography and etching to expose a part of the top face of the source/drain electrode 177 as illustrated in FIG. 3H. Further, the method forms a pixel electrode 181 on the interlayer insulating layer 121 as well as a via for connecting the pixel electrode 181 and the source/drain electrode 177 in the interlayer insulating layer 121. Specifically, the method forms an ITO film of about 50 nm in thickness by sputtering and patterns the ITO film by photolithography and etching.

As illustrated in FIG. 3D, in forming the second oxide semiconductor film 173, the first oxide semiconductor film 133 is covered with the second insulating layer 119. Accordingly, the first oxide semiconductor film 133 is free from the effect of forming and patterning the second oxide semiconductor film 173. For this reason, desirable oxide semiconductor materials can be employed for the first oxide semiconductor film 133 and the second oxide semiconductor film 173.

Embodiment 2

Configuration of TFT Substrate

Figure 4:
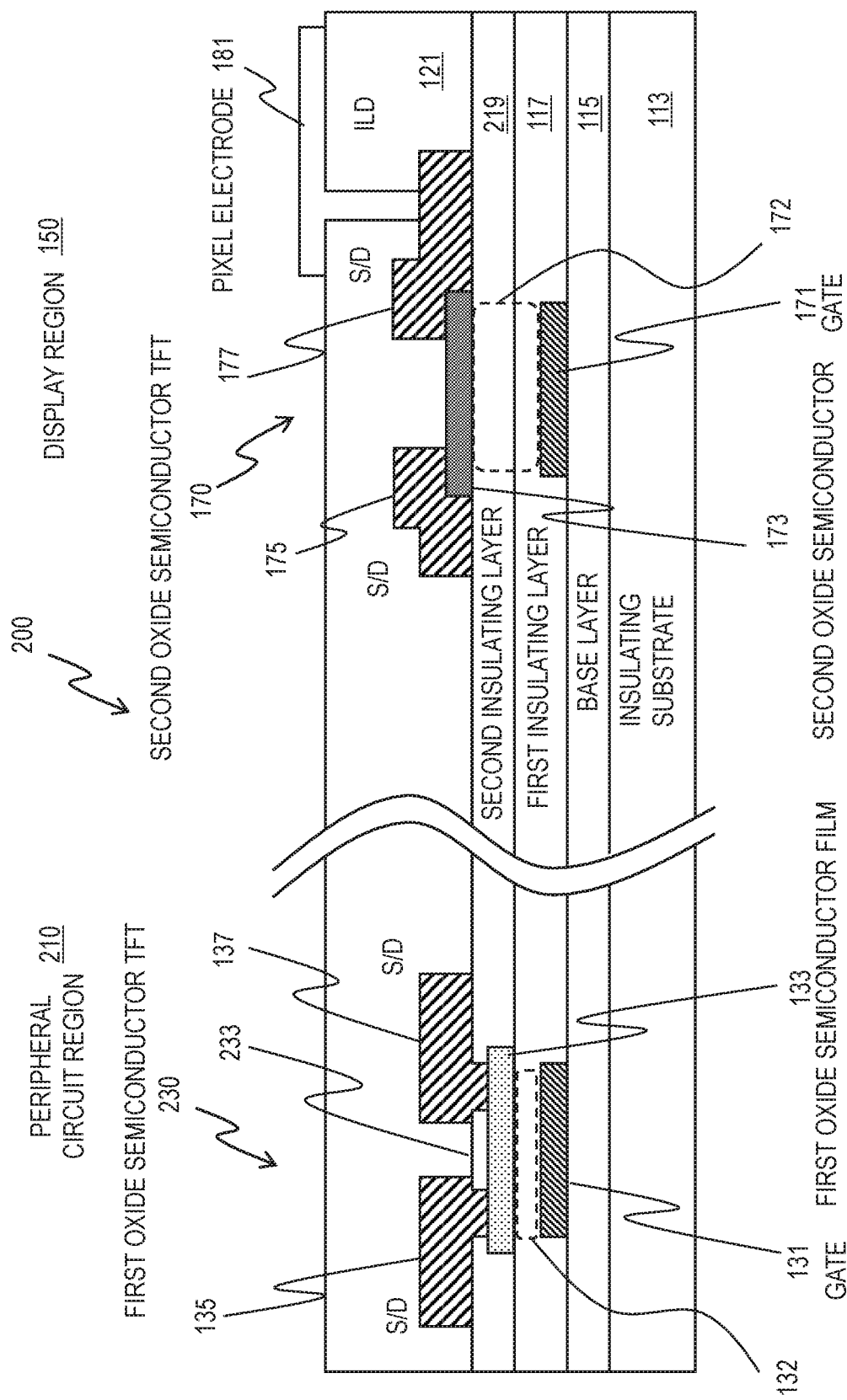
FIG. 4 schematically illustrates a cross-section of another configuration example of a TFT substrate for a liquid crystal display panel.

Hereinafter, another configuration example of a TFT substrate and a method of manufacturing the TFT substrate are described. FIG. 4 schematically illustrates a cross-section of a configuration example of another TFT substrate 200 for a liquid crystal display panel. In the following, differences from the configuration example illustrated in FIG. 2 are mainly described.

The TFT substrate 200 includes a first oxide semiconductor TFT 230 in a peripheral circuit region 210 and a second oxide semiconductor TFT 170 in a display region 150. The configuration of the second oxide semiconductor TFT 170 is the same as the configuration in FIG. 2. The first oxide semiconductor TFT 230 includes an etching stop film 233 in addition to the configuration of the first oxide semiconductor TFT 130 in FIG. 2. The etching stop film 233 is provided in contact with the first oxide semiconductor film 133. The etching stop film 233 is located between the source/drain electrodes 135 and 137 and above the channel region of the first oxide semiconductor film 133.

The etching stop film 233 is a part of the second insulating layer 219. The etching stop film 233 prevents the channel region of the oxide semiconductor film 133 from being exposed to etchant in the process of etching the second insulating layer 219 for the contacts between the oxide semiconductor film 133 and the source/drain electrodes 135 and 137.

Method of Manufacturing TFT Substrate

Figure 5A:
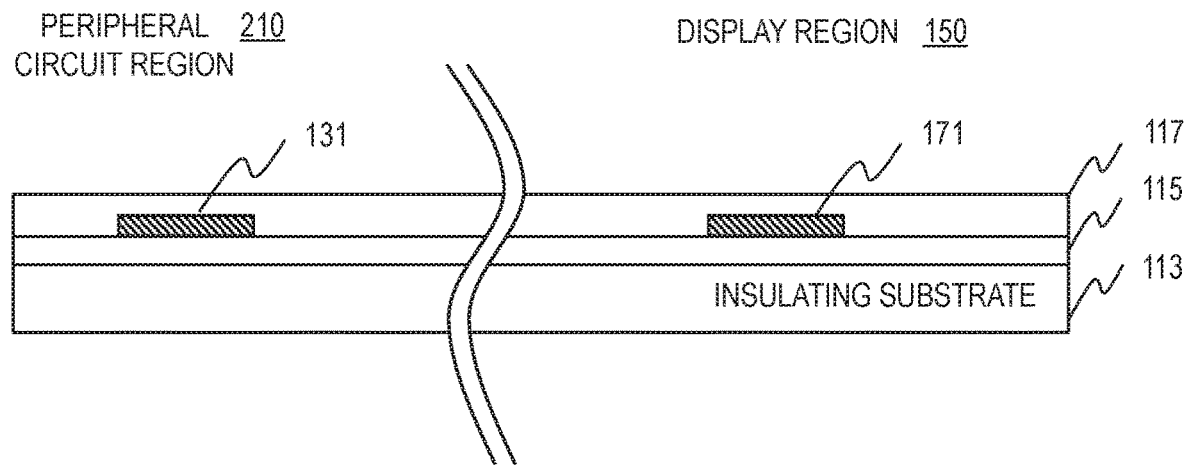
FIG. 5A illustrates a step of a method of manufacturing the TFT substrate illustrated in FIG. 4.

An example of a method of manufacturing the TFT substrate 200 illustrated in FIG. 4 is described. As illustrated in FIG. 5A, the method of manufacturing the TFT substrate 200 forms a base layer 115 by CVD on an insulating substrate 113. Next, the method forms a metal layer (gate electrode layer) including gate electrodes 131 and 171 on the base layer 115. Specifically, the method forms a metal film by sputtering and patterns the metal film by photolithography and etching. Further, the method forms a first insulating layer 117 by CVD to cover the gate electrode layer.

Figure 5B:
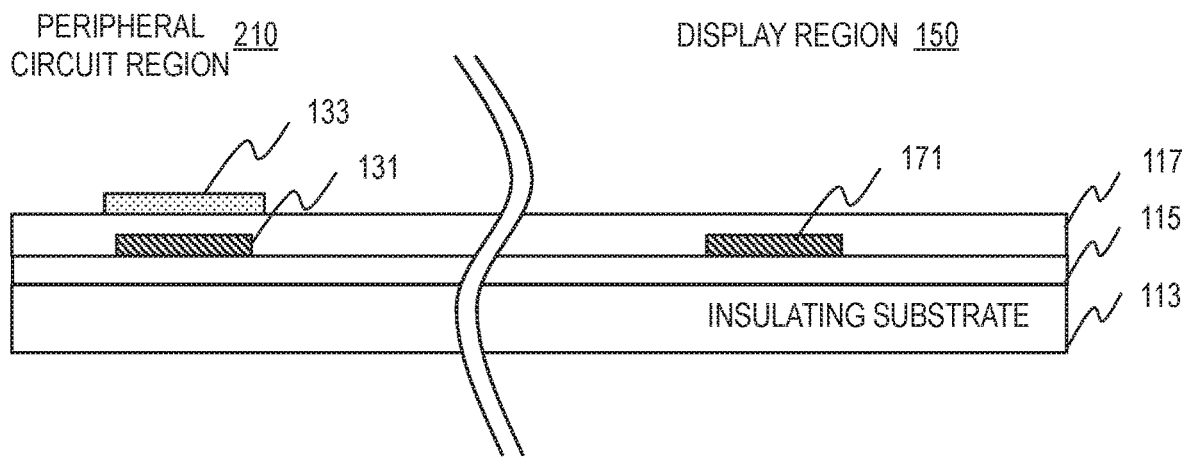
FIG. 5B illustrates a step of a method of manufacturing the TFT substrate illustrated in FIG. 4.

Next, the method forms an oxide semiconductor layer (first oxide semiconductor layer) including a first oxide semiconductor film 133 on the first insulating layer 117 as illustrated in FIG. 5B. Specifically, the method forms an oxide semiconductor layer by sputtering and patterns the oxide semiconductor layer by photolithography and etching. As a result, a pattern of the oxide semiconductor film is formed.

Figure 5C:
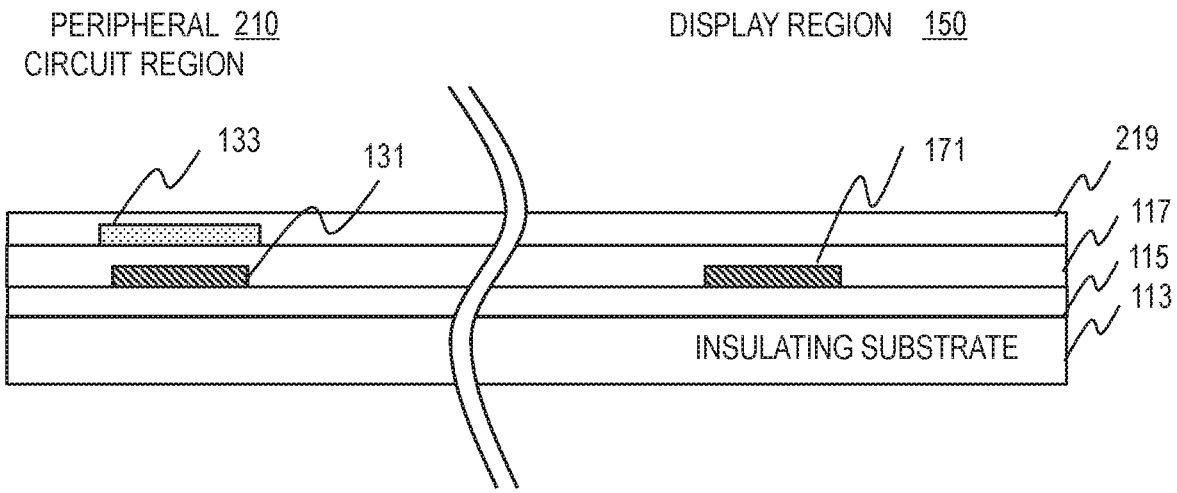
FIG. 5C illustrates a step of a method of manufacturing the TFT substrate illustrated in FIG. 4.
Figure 5D:
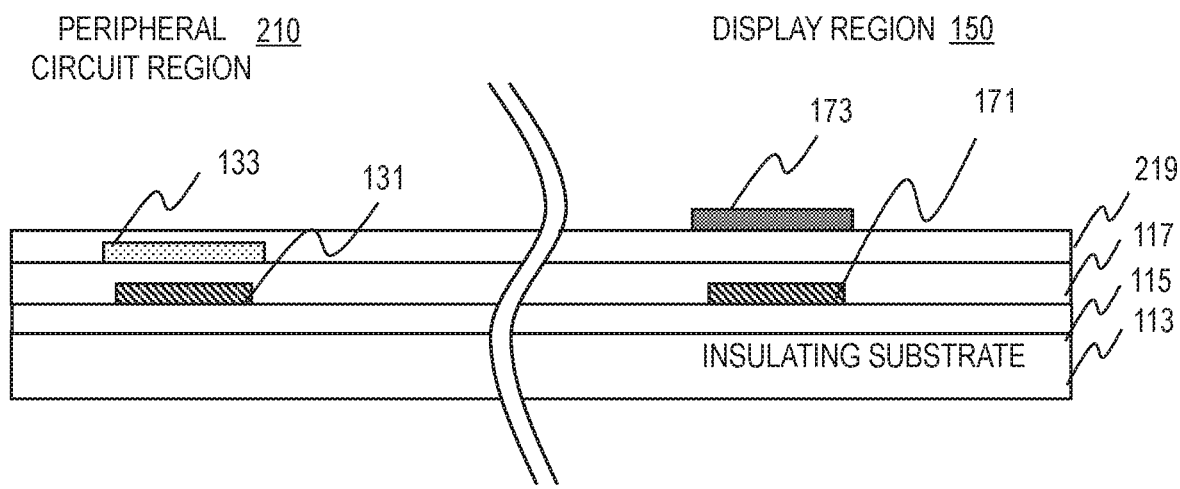
FIG. 5D illustrates a step of a method of manufacturing the TFT substrate illustrated in FIG. 4.

Next, the method forms a second insulating layer 219 by CVD to cover the first oxide semiconductor film 133 as illustrated in FIG. 5C. Next, the method forms an oxide semiconductor layer (second oxide semiconductor layer) including a second oxide semiconductor film 173 on the second insulating layer 219 as illustrated in FIG. 5D. Specifically, the method forms an oxide semiconductor layer by sputtering and patterns the oxide semiconductor layer by photolithography and etching. As a result, a pattern of the oxide semiconductor film is formed.

Figure 5E:
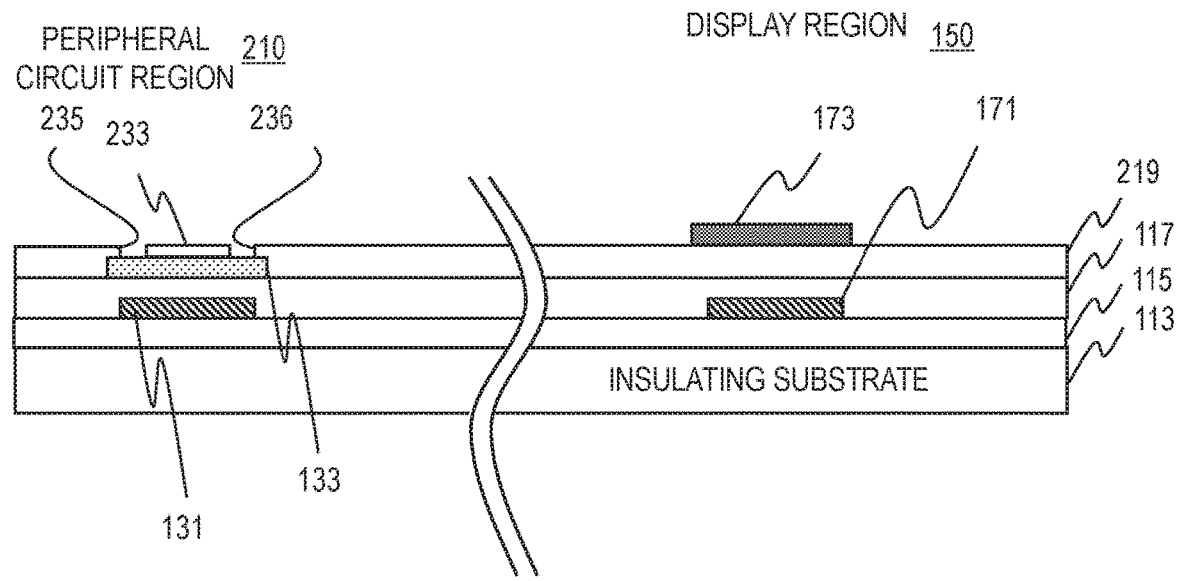
FIG. 5E illustrates a step of a method of manufacturing the TFT substrate illustrated in FIG. 4.

Next, the method opens openings 235 and 236 in the second insulating layer 219 by photolithography and etching as illustrated in FIG. 5E. The opening 235 is for the contact between the source/drain electrode 135 and the first oxide semiconductor film 133 and the opening 236 is for the contact between the source/drain electrode 137 and the first oxide semiconductor film 133. The openings 235 and 236 are formed to expose the top face of the first oxide semiconductor film 133 in the openings. As a result of forming the openings 235 and 236, an etching stop film 233 is prepared. Although the end faces of the first oxide semiconductor film 133 are not exposed in the openings 235 and 236, they can be exposed.

Figure 5F:
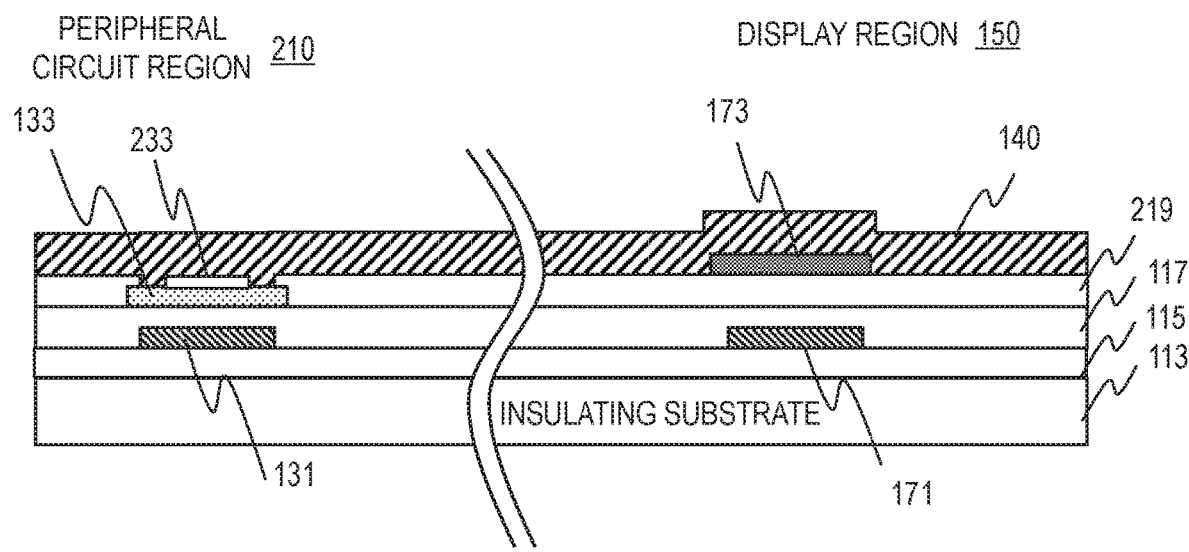
FIG. 5F illustrates a step of a method of manufacturing the TFT substrate illustrated in FIG. 4.
Figure 5G:
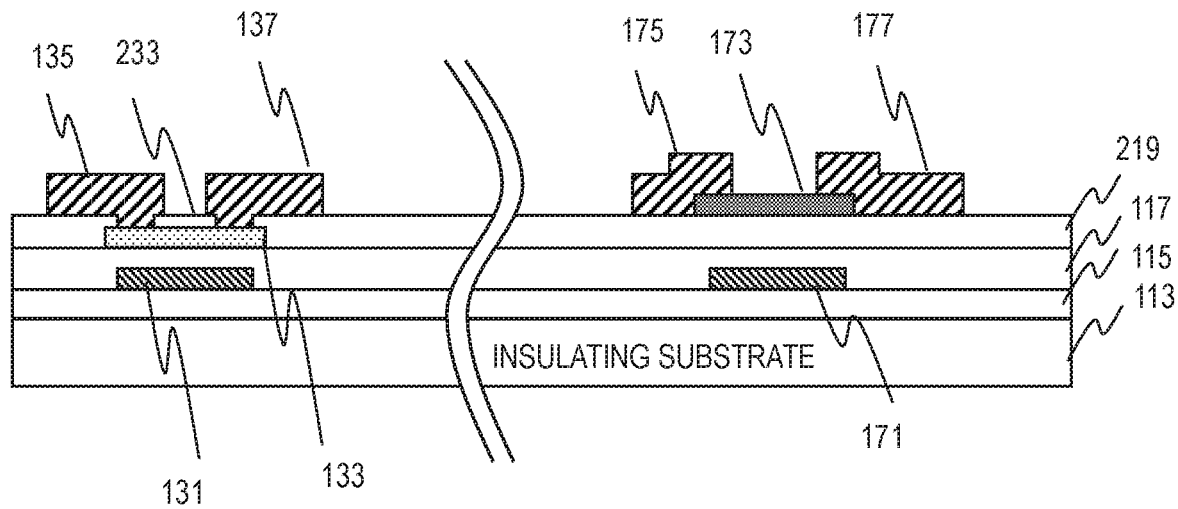
FIG. 5G illustrates a step of a method of manufacturing the TFT substrate illustrated in FIG. 4.

Next, the method forms a metal layer (source/drain electrode layer) 140 including source/drain electrodes 135, 137, 175, and 177 by sputtering as illustrated in FIG. 5F. The metal layer 140 covers the second insulating layer 219 and the second oxide semiconductor film 173. The metal layer 140 fills the openings 235 and 236 in the second insulating layer 219 and contacts the top face of the first oxide semiconductor film 133. Next, the method patterns the metal layer 140 by photolithography and etching to form the source/drain electrodes 135, 137, 175, and 177 as illustrated in FIG. 5G.

Figure 5H:
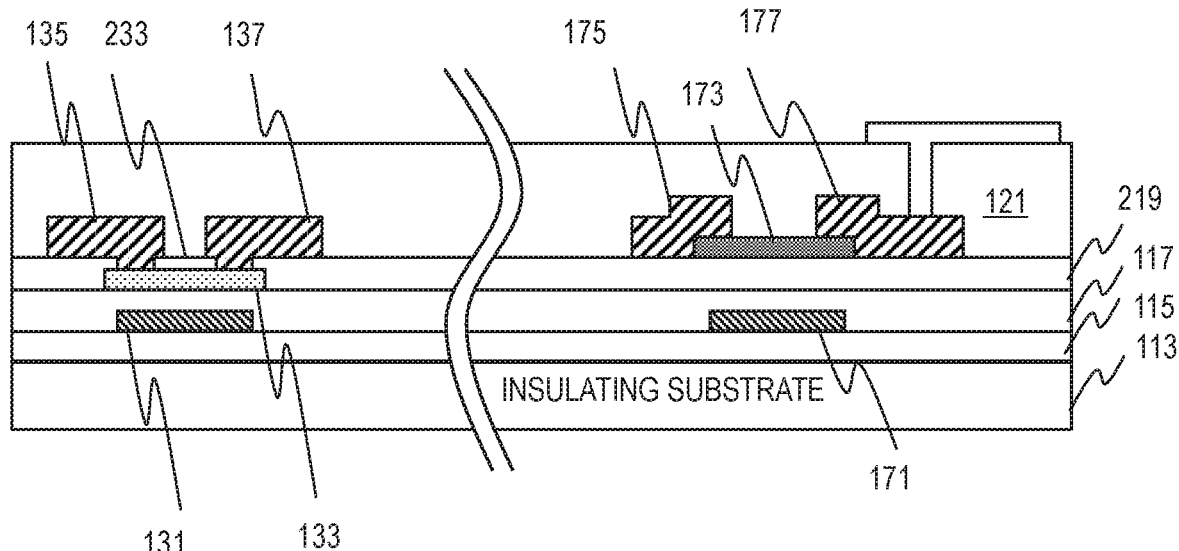
FIG. 5H illustrates a step of a method of manufacturing the TFT substrate illustrated in FIG. 4.

Next, the method forms an interlayer insulating layer 121 by CVD to cover the source/drain electrodes 135, 137, 175, 177, the etching stop film 233, and the second insulating layer 219, and opens a via hole in the interlayer insulating layer 121 by photolithography and etching to expose a part of the top face of the source/drain electrode 177 as illustrated in FIG. 5H. Further, the method forms a pixel electrode 181 on the interlayer insulating layer 121 as well as a via for connecting the pixel electrode 181 and the source/drain electrode 177 in the interlayer insulating layer 121. Specifically, the method forms an ITO film by sputtering and patterns the ITO film by photolithography and etching.

As illustrated in FIG. 5D, in forming the second oxide semiconductor film 173, the first oxide semiconductor film 133 is covered with the second insulating layer 219. Accordingly, the first oxide semiconductor film 133 is free from the effect of forming and patterning the second oxide semiconductor film 173. For this reason, desirable oxide semiconductor materials can be employed for the first oxide semiconductor film 133 and the second oxide semiconductor film 173.

Embodiment 3

Configuration of TFT Substrate

Figure 6:
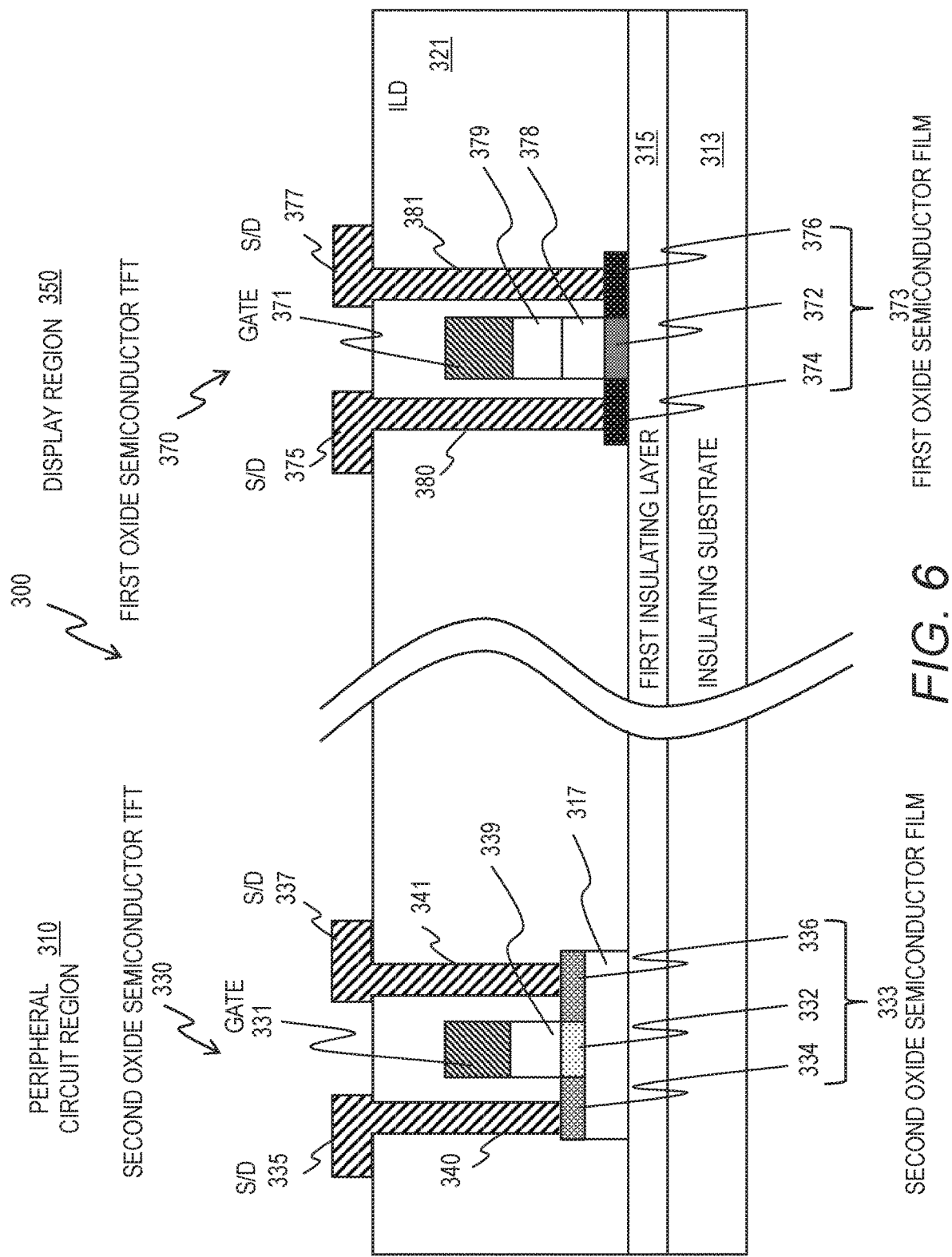
FIG. 6 schematically illustrates a cross-section of still another configuration example of a TFT substrate for a liquid crystal display panel.

Hereinafter, still another configuration example of a TFT substrate and a method of manufacturing the TFT substrate are described. FIG. 6 schematically illustrates a cross-section of a configuration example of another TFT substrate 300 for a liquid crystal display panel. FIG. 6 illustrates one first oxide semiconductor TFT 370 in a display region 350 of the TFT substrate 300 and one second oxide semiconductor TFT 330 in a peripheral circuit region 310 of the TFT substrate 300 by way of example. The peripheral circuit region 310 is located outer than the display region 350 and is a region to mount peripheral circuits. The display region 350 is a region including pixels. FIG. 6 omits a pixel electrode and an interlayer insulating layer covering the first oxide semiconductor TFT 370 and the second oxide semiconductor TFT 330.

The first oxide semiconductor TFT 370 is a switching TFT for selecting a pixel to supply a data signal. The second oxide semiconductor TFT 330 can be an oxide semiconductor TFT in a scanning driver. The first oxide semiconductor TFT 370 and the second oxide semiconductor TFT 330 have a top-gate structure.

The first oxide semiconductor TFT 370 and the second oxide semiconductor TFT 330 are fabricated on a flexible or inflexible insulating substrate 313 made of resin or glass. The oxide semiconductor film (first oxide semiconductor film) 373 of the first oxide semiconductor TFT 370 and the oxide semiconductor film (second oxide semiconductor film) 333 of the second oxide semiconductor TFT 330 are made of different oxide semiconductor materials and have different characteristics. In this example, the mobility of the second oxide semiconductor film 333 is higher than the mobility of the first oxide semiconductor film 373 and the bandgap of the first oxide semiconductor film 373 is wider than the bandgap of the second oxide semiconductor film 333. Because of the difference in characteristics between two oxide semiconductor films, a slim bezel and high reliability are both achieved.

Examples of the oxide semiconductor material that can be used for the second oxide semiconductor film 333 include ITZO, IGZTO, In—Zn—Ti—O, and In—W—Z—O. Examples of the oxide semiconductor material that can be used for the first oxide semiconductor film 373 include IGZO, GaZnO, and IGO.

The oxide semiconductor film (second oxide semiconductor film) 333 of the second oxide semiconductor TFT 330 is provided above and in contact with an insulating film 317 included in a second insulating layer. The second insulating layer including the insulating film 317 is located upper than a first insulating layer 315. The oxide semiconductor film (first oxide semiconductor film) 373 of the first oxide semiconductor TFT 370 is provided above and in contact with the first insulating layer 315. The first insulating layer 315 is a base layer. The second oxide semiconductor film 333 is located upper than the first oxide semiconductor film 373. The first insulating layer 315 and the second insulating layer including the second insulating film 317 can be made of silicon nitride or silicon oxide.

In the configuration example in FIG. 6, the entire second oxide semiconductor film 333 is provided above and in contact with the insulating film 317 and the entire first oxide semiconductor film 373 is provided above and in contact with the first insulating layer 315. The second insulating layer including the insulating film 317 is provided above and in contact with the first insulating layer 315. The second oxide semiconductor film 333 and the second insulating layer including the insulating film 317 are both provided above and in contact with the first insulating layer 315.

The second oxide semiconductor TFT 330 includes the second oxide semiconductor film 333, a gate electrode 331 located upper than the second oxide semiconductor film 333, and a gate insulating film 339 located between the gate electrode 331 and the second oxide semiconductor film 333 in the layering direction.

The second oxide semiconductor film 333 includes source/drain regions 334 and 336 and a channel region 332 between the source/drain regions 334 and 336. The source/drain regions 334 and 336 are low-resistive regions and the channel region 332 is a region not reduced in resistance, namely a highly-resistive region. The gate insulating film 339 is provided above and in contact with the channel region 332. A gate electrode 331 is provided above and in contact with the gate insulating film 339.

Source/drain electrodes 335 and 337 are provided above and in contact with an interlayer insulating layer 321. The source/drain electrodes 335 and 337 are connected with the source/drain regions 334 and 336 through vias 340 and 341 provided in the interlayer insulating layer 321. The vias 340 and 341 are continued from the source/drain electrodes 335 and 337 and provided above and in contact with the source/drain regions 334 and 336.

The first oxide semiconductor TFT 370 includes the first oxide semiconductor film 373, a gate electrode 371 located upper than the first oxide semiconductor film 373, and a gate insulating film having a laminate structure consisting of insulating films 378 and 379 provided between the gate electrode 371 and the first oxide semiconductor film 373 in the layering direction.

The first oxide semiconductor film 373 includes source/drain regions 374 and 376 and a channel region 372 between the source/drain regions 374 and 376. The source/drain regions 374 and 376 are low-resistive regions and the channel region 372 is a region not reduced in resistance, namely a highly-resistive region. The lower gate insulating film 378 is provided above and in contact with the channel region 372. The lower gate insulating film 378 is a part of the second insulating layer, like the insulating film 317. The upper gate insulating film 379 is a part of the same insulating layer as the insulating film 339. A gate electrode 371 is provided above and in contact with the upper gate insulating film 379.

Source/drain electrodes 375 and 377 are provided above and in contact with the interlayer insulating layer 321. The source/drain electrodes 375 and 377 are connected with the source/drain regions 374 and 376 through vias 380 and 381 provided in the interlayer insulating layer 321. The vias 380 and 381 are continued from the source/drain electrodes 375 and 377 and provided above and in contact with the source/drain regions 374 and 376.

The interlayer insulating layer 321 covers the constituent elements except for the source/drain electrodes 335, 337, 375, and 377 of the second oxide semiconductor TFT 330 and the first oxide semiconductor TFT 370. The interlayer insulating layer 321 can be made of silicon oxide or silicon nitride. The insulating layer (third insulating layer) including the insulating films 339 and 379 can be made of silicon oxide or silicon nitride.

The gate electrodes 331 and 371 are parts included in the same metal layer. The material for the gate electrodes 331 and 371 can be selected desirably from Mo, W, Nb, and Al, for example. The source/drain electrodes 335, 337, 375, and 377 of the second oxide semiconductor TFT 330 and the first oxide semiconductor TFT 370 are parts included in the same metal layer. The source/drain electrodes 335, 337, 375, and 377 can be prepared by depositing and patterning conductive films of Ti/Al/Ti, for example. The source/drain electrodes 335, 337, 375, and 377 can have a single layer structure or be made of metals different from these metals.

Method of Manufacturing TFT Substrate

Figure 7A:
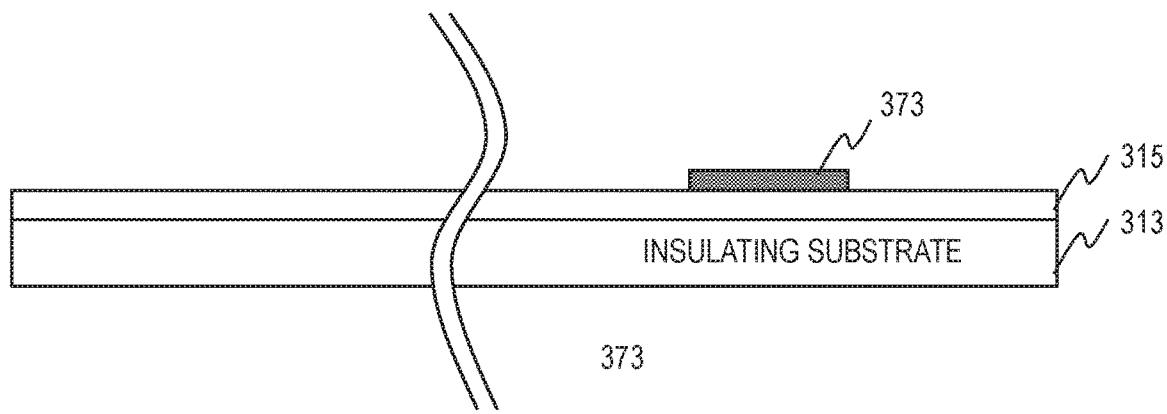
FIG. 7A illustrates a step of a method of manufacturing the TFT substrate illustrated in FIG. 6.

An example of a method of manufacturing the TFT substrate 300 illustrated in FIG. 6 is described. As illustrated in FIG. 7A, the method of manufacturing the TFT substrate 300 forms a first insulating layer 315 of a base layer by CVD on an insulating substrate 313. Next, the method forms an oxide semiconductor layer (first oxide semiconductor layer) including a first oxide semiconductor film 373 on the first insulating layer 315. Specifically, the method forms an oxide semiconductor film by sputtering and patterns the oxide semiconductor film by photolithography and etching. As a result, a pattern of the oxide semiconductor film is formed.

Figure 7B:
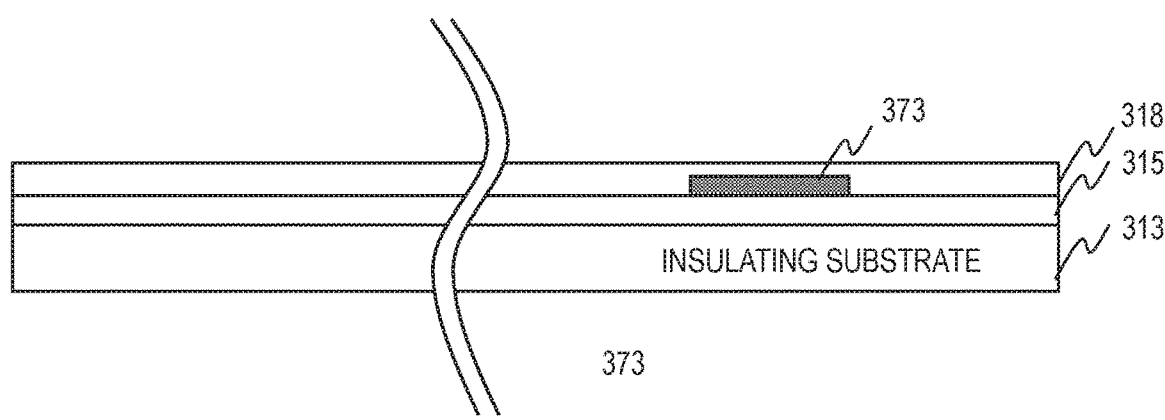
FIG. 7B illustrates a step of a method of manufacturing the TFT substrate illustrated in FIG. 6.

Next, the method forms a second insulating layer 318 by CVD to cover the first oxide semiconductor film 373 as illustrated in FIG. 7B. The second insulating layer 318 includes the insulating films 317 and 378 in FIG. 6.

Figure 7C:
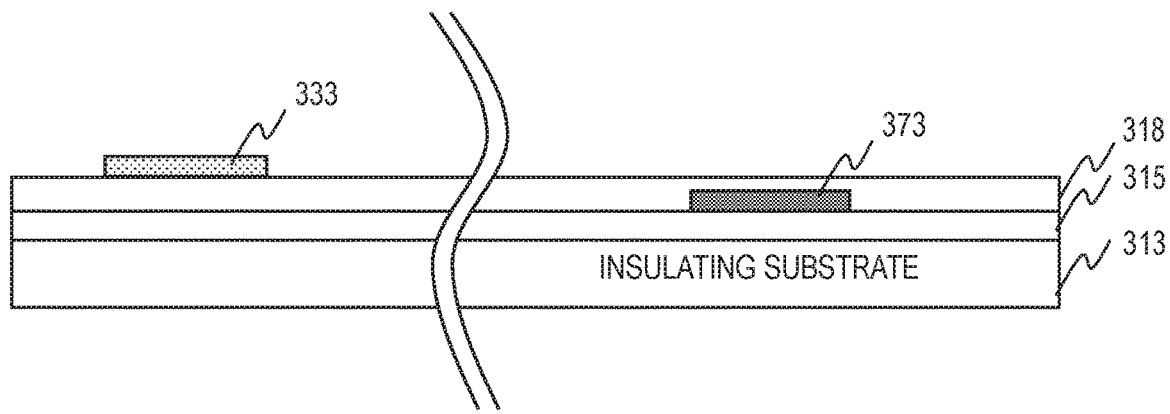
FIG. 7C illustrates a step of a method of manufacturing the TFT substrate illustrated in FIG. 6.

Next, the method forms an oxide semiconductor layer (second oxide semiconductor layer) including a second oxide semiconductor film 333 on the second insulating layer 318 as illustrated in FIG. 7C. Specifically, the method forms an oxide semiconductor film by sputtering and patterns the oxide semiconductor film by photolithography and etching. As a result, a pattern of the oxide semiconductor film is formed.

Figure 7D:
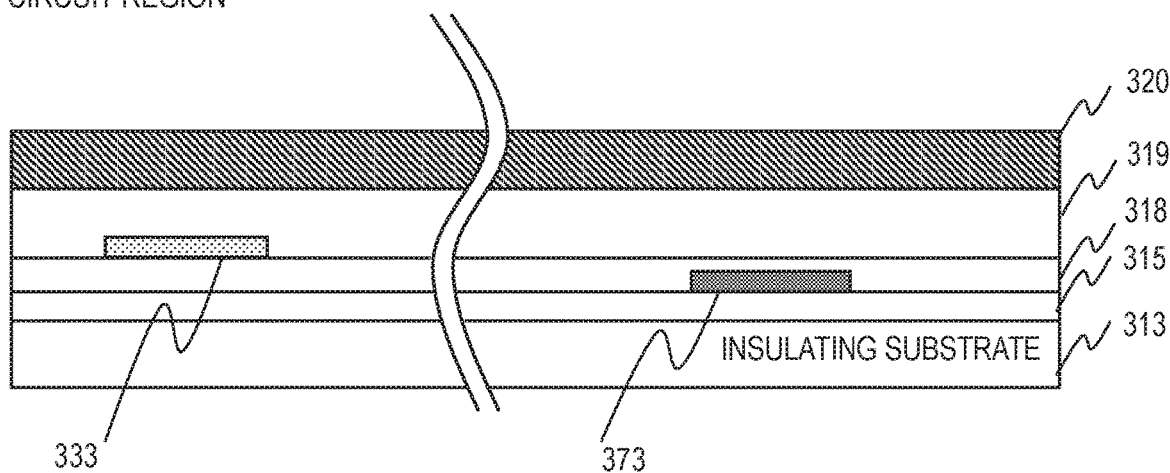
FIG. 7D illustrates a step of a method of manufacturing the TFT substrate illustrated in FIG. 6.

Next, the method forms a third insulating layer 319 by CVD to cover the second oxide semiconductor film 333 and the second insulating layer 318 as illustrated in FIG. 7D. The third insulating layer 319 includes the insulating films 339 and 379 in FIG. 6. Further, the method forms a metal layer (gate electrode layer) 320 including gate electrodes 331 and 371 on the third insulating layer 319 by sputtering.

Figure 7E:
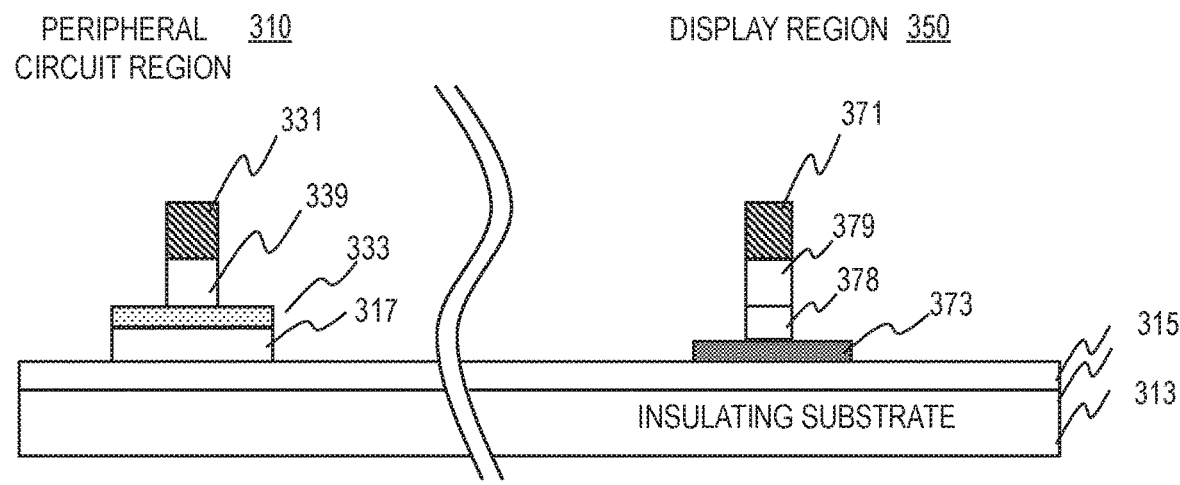
FIG. 7E illustrates a step of a method of manufacturing the TFT substrate illustrated in FIG. 6.
Figure 7F:
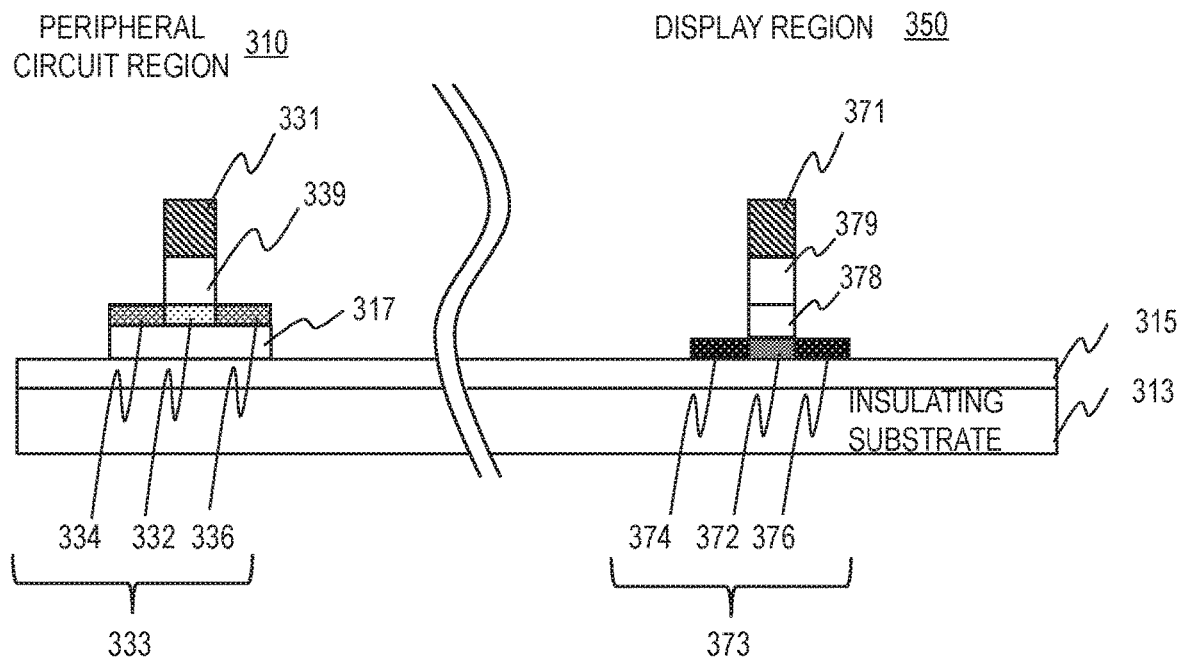
FIG. 7F illustrates a step of a method of manufacturing the TFT substrate illustrated in FIG. 6.

Next, the method etches the second insulating layer 318, the third insulating layer 319, and the gate electrode layer 320 together to prepare insulating films 339, 317, insulating films 379, 378, and gate electrodes 331, 371 as illustrated in FIG. 7E. Next, the method reduces the resistance of the part uncovered with the gate insulating film 339 in the second oxide semiconductor film 333 and the part uncovered with the gate insulating film 378 in the second oxide semiconductor film 373 by exposing these parts to He plasma as illustrated in FIG. 7F. As a result, source/drain regions 334, 336, 374, and 376 are prepared.

Figure 7G:
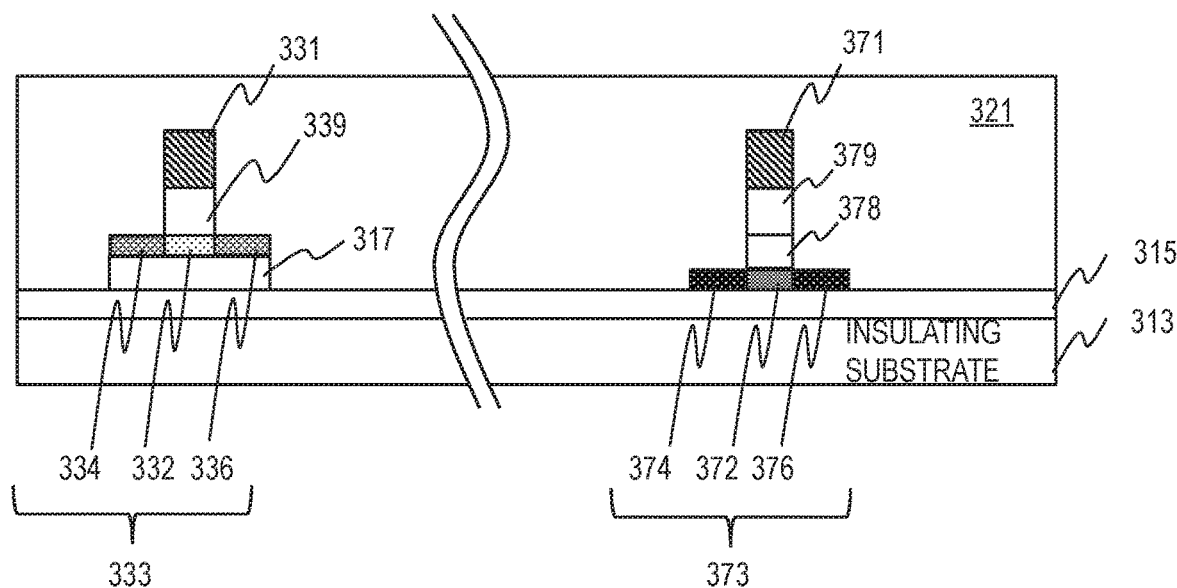
FIG. 7G illustrates a step of a method of manufacturing the TFT substrate illustrated in FIG. 6.
Figure 7H:
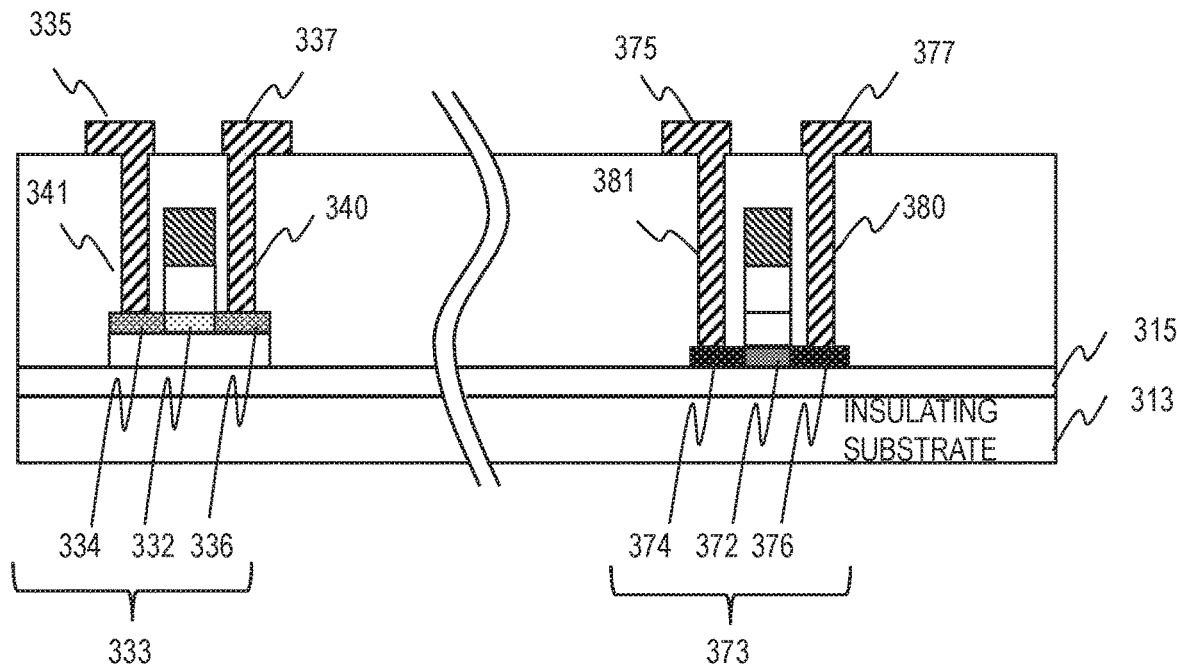
FIG. 7H illustrates a step of a method of manufacturing the TFT substrate illustrated in FIG. 6.

Next, the method forms an interlayer insulating layer 321 by CVD to cover the prepared constituent elements of the first oxide semiconductor TFT 370, the prepared constituent elements of the second oxide semiconductor TFT 330, and the first insulating layer 315 as illustrated in FIG. 7G. Next, the method opens via holes in the interlayer insulating layer 321 by photolithography and etching and further, prepares source/drain electrodes 335, 337, 375, 377 and vias 340, 341, 380, 381 as illustrated in FIG. 7H. Specifically, the method forms a metal layer on the interlayer insulating layer 321 (including inside the via holes) by sputtering and forms the source/drain electrodes 335, 337, 375, 377 and the vias 340, 341, 380, 381 by photolithography and etching. Description of the following formation of an interlayer insulating layer for covering the first oxide semiconductor TFT 370 and the second oxide semiconductor TFT 330 and a pixel electrode is omitted here.

As illustrated in FIG. 7C, in forming the second oxide semiconductor film 333, the first oxide semiconductor film 373 is covered with the second insulating layer 318. Accordingly, the first oxide semiconductor film 373 is free from the effect of forming and patterning the second oxide semiconductor film 333. For this reason, desirable oxide semiconductor materials can be employed for the first oxide semiconductor film 373 and the second oxide semiconductor film 333.

Embodiment 4

Configuration of TFT Substrate

Figure 8:
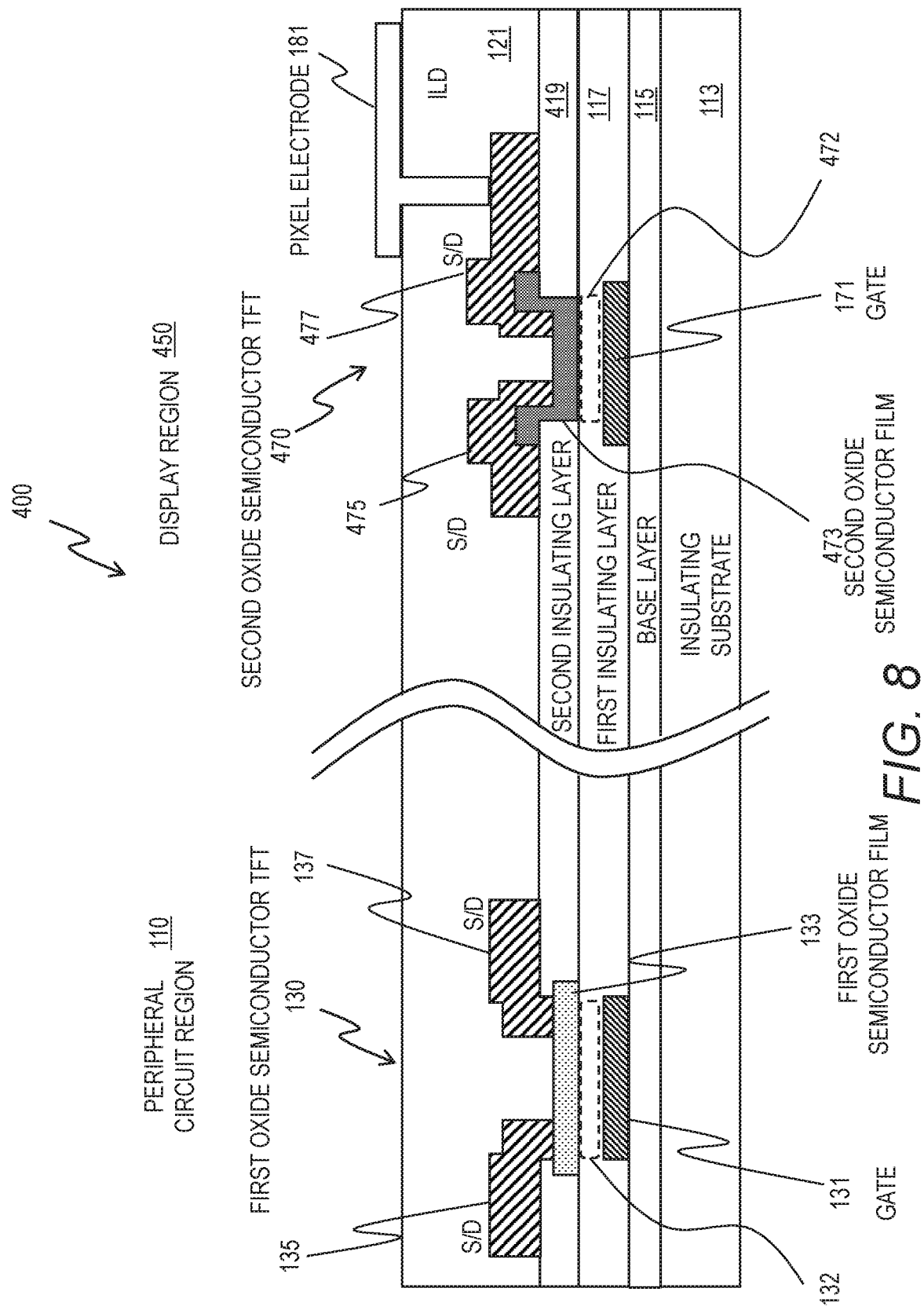
FIG. 8 schematically illustrates a cross-section of still another configuration example of a TFT substrate for a liquid crystal display panel.

Hereinafter, still another configuration example of a TFT substrate and a method of manufacturing the TFT substrate are described. FIG. 8 schematically illustrates a cross-section of a configuration example of another TFT substrate 400 for a liquid crystal display panel. In the following, differences from the configuration example illustrated in FIG. 2 are mainly described.

The TFT substrate 400 includes a first oxide semiconductor TFT 130 in a peripheral circuit region 110 and a second oxide semiconductor TFT 470 in a display region 450. The configuration of the first oxide semiconductor TFT 130 is the same as the configuration in FIG. 2. The second oxide semiconductor TFT 470 is different in the shapes of the second oxide semiconductor film 473, the gate insulating film 472, and the source/drain electrodes 475, 477 from the second oxide semiconductor TFT 170 in the configuration example illustrated in FIG. 2.

The second insulating layer 419 provided above and in contact with the first insulating layer 117 has an opening; a part of the second oxide semiconductor film 473 is provided in the opening. The second oxide semiconductor film 473 is in contact with the first insulating layer 117 within the opening of the second insulating layer 419. A part of the second oxide semiconductor film 473 including its end is located above the second insulating layer 419. As understood from this description, the second oxide semiconductor film 473 is partially located above and in contact with the second insulating layer 419 and partially located above and in contact with the first insulating layer 117.

The first insulating layer 117 is the lowermost insulating layer among the insulating layers located lower than and in contact with the second oxide semiconductor film 473. The second insulating layer 419 is the uppermost insulating layer among the insulating layers located lower than and in contact with the second oxide semiconductor film 473.

The gate insulating film 472 has a single layer structure and is a part of the first insulating layer 117. Thinning the gate insulating film 472 enhances the driving ability of the second oxide semiconductor TFT 470. Each of the source/drain electrodes 475 and 477 is in contact with a part of the second oxide semiconductor film 473 on the second insulating layer 419 and a part of the second oxide semiconductor film 473 in the opening. Such a contact structure achieves low contact resistance between the second oxide semiconductor film 473 and the source/drain electrodes 475, 477.

Method of Manufacturing TFT Substrate

Figure 9A:
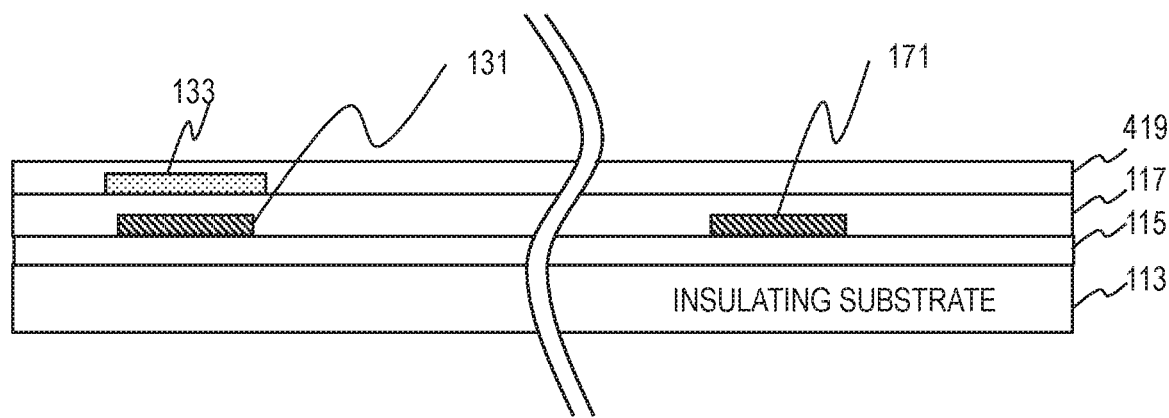
FIG. 9A illustrates a step of a method of manufacturing the TFT substrate illustrated in FIG. 8.

An example of a method of manufacturing the TFT substrate 400 illustrated in FIG. 8 is described. After performing the steps described with reference to FIGS. 3A and 3B, the method forms a second insulating layer 419 by CVD to cover the first oxide semiconductor film 133 as illustrated in FIG. 9A.

Figure 9B:
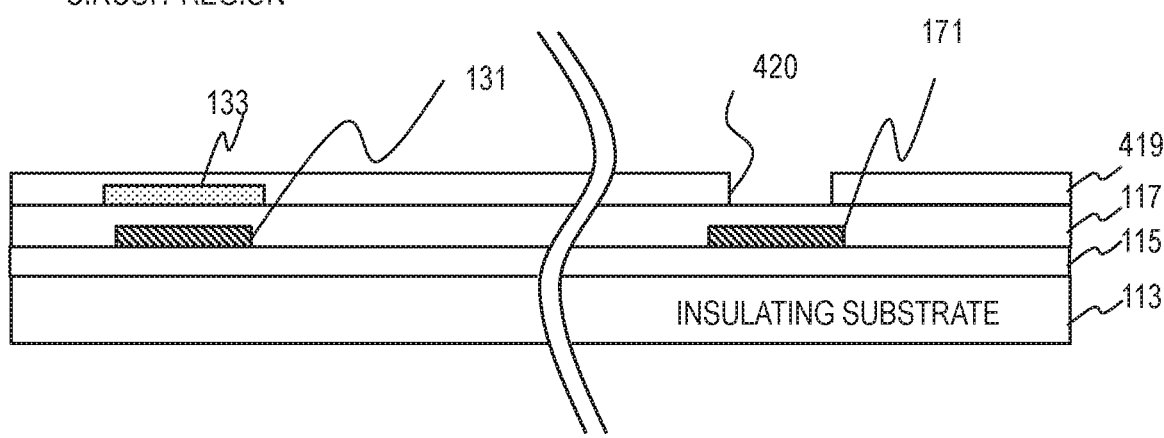
FIG. 9B illustrates a step of a method of manufacturing the TFT substrate illustrated in FIG. 8.
Figure 9C:
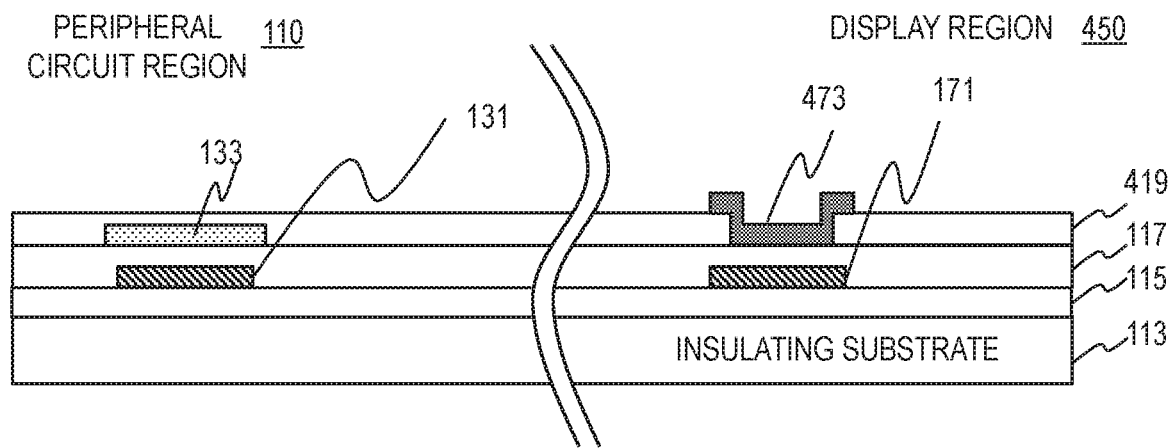
FIG. 9C illustrates a step of a method of manufacturing the TFT substrate illustrated in FIG. 8.

Next, the method opens an opening 420 in the second insulating layer 419 by photolithography and etching as illustrated in FIG. 9B. The top face of the first insulating layer 117 is exposed in the opening 420. Next, the method forms an oxide semiconductor layer (second oxide semiconductor layer) including a second oxide semiconductor film 473 on the second insulating layer 419 as illustrated in FIG. 9C. Specifically, the method forms an oxide semiconductor layer by sputtering and patterns the oxide semiconductor layer by photolithography and etching. As a result, a pattern of the oxide semiconductor film is formed. A part of the second oxide semiconductor film 473 is located in the opening 420 in the second insulating layer 419 and another part including its end is located above and in contact with the second insulating layer 419.

Figure 9D:
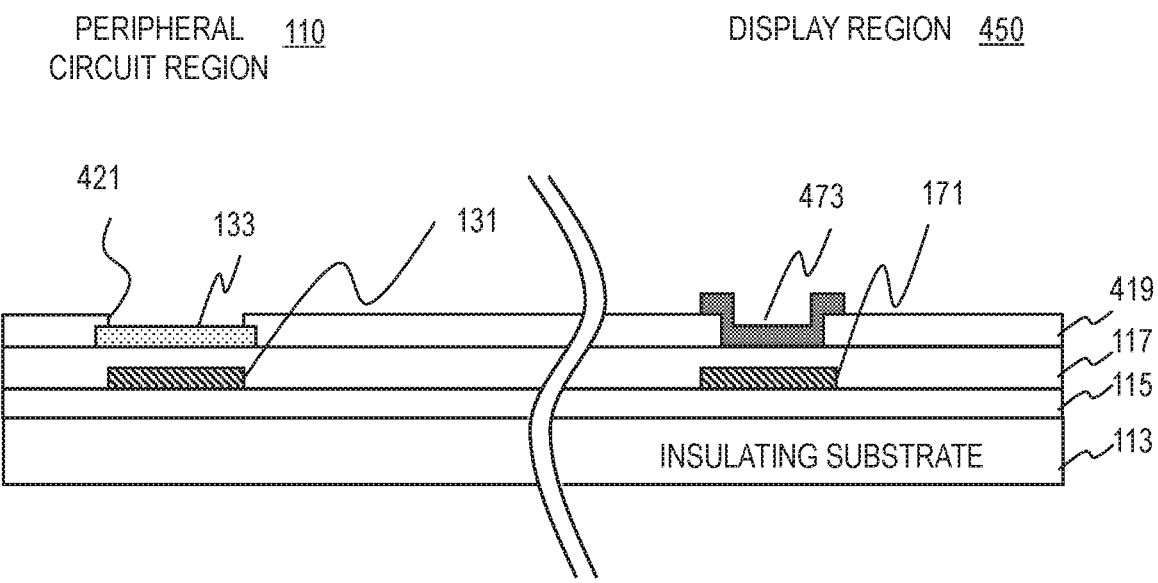
FIG. 9D illustrates a step of a method of manufacturing the TFT substrate illustrated in FIG. 8.

Next, the method opens an opening 421 in the second insulating layer 419 by photolithography and etching as illustrated in FIG. 9D. The opening 421 is formed to expose the top face of the first oxide semiconductor film 133 within the opening. In this example, the end face of the first oxide semiconductor film 133 is not exposed in the opening 421 but can be exposed.

Figure 9E:
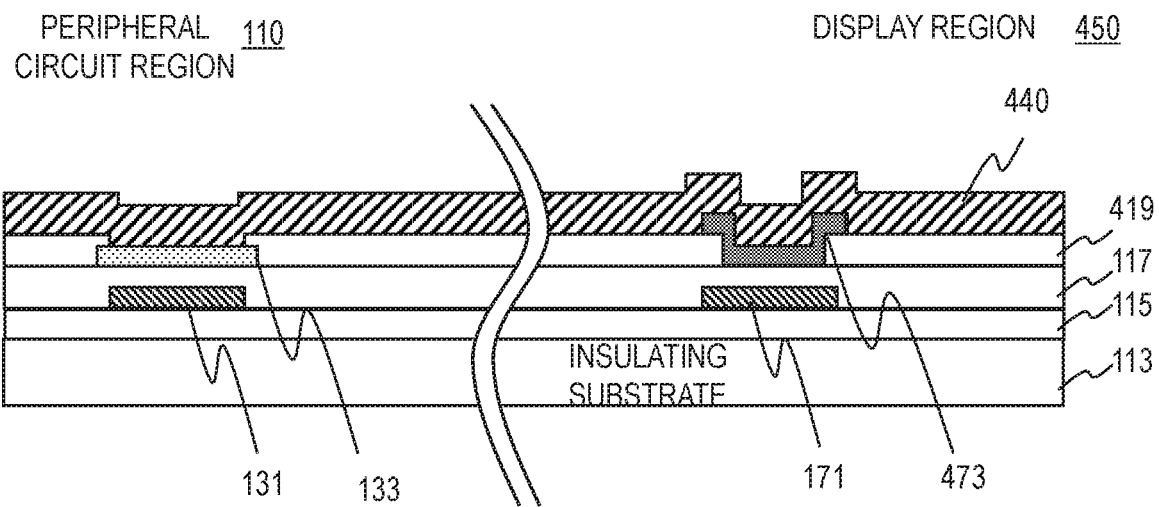
FIG. 9E illustrates a step of a method of manufacturing the TFT substrate illustrated in FIG. 8.
Figure 9F:
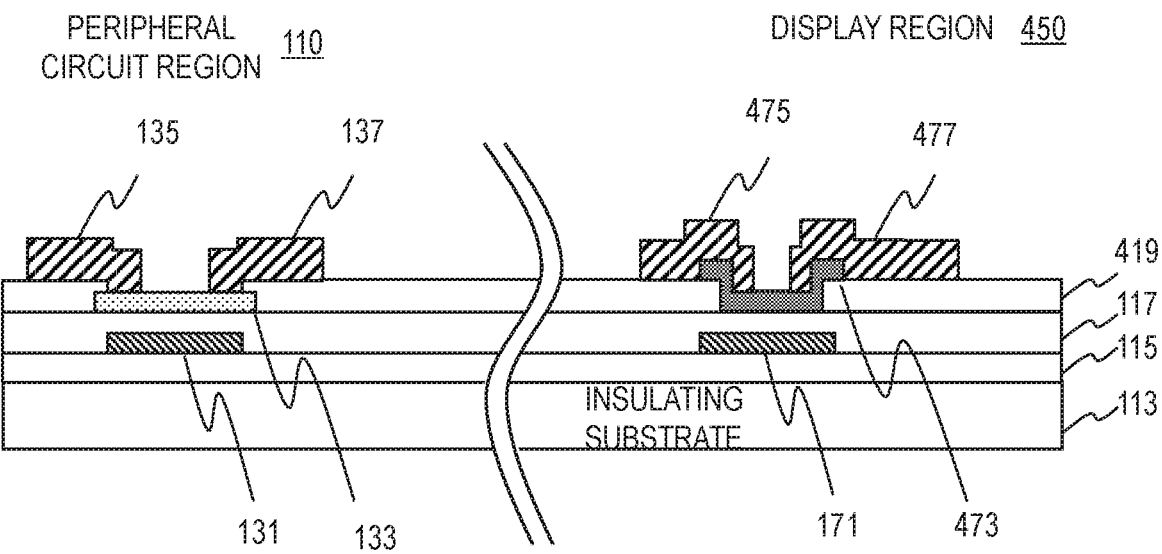
FIG. 9F illustrates a step of a method of manufacturing the TFT substrate illustrated in FIG. 8.

Next, the method forms a metal layer (source/drain electrode layer) 440 including source/drain electrodes 135, 137, 475, and 477 by sputtering as illustrated in FIG. 9E. The metal layer 440 covers the second insulating layer 419, the first oxide semiconductor film 133, and the second oxide semiconductor film 473. The metal layer 440 fills the opening 421 in the second insulating layer 419 and contacts the top face of the first oxide semiconductor film 133. Next, the method patterns the metal layer 440 by photolithography and etching to form the source/drain electrodes 135, 137, 475, and 477 as illustrated in FIG. 9F.

Figure 9G:
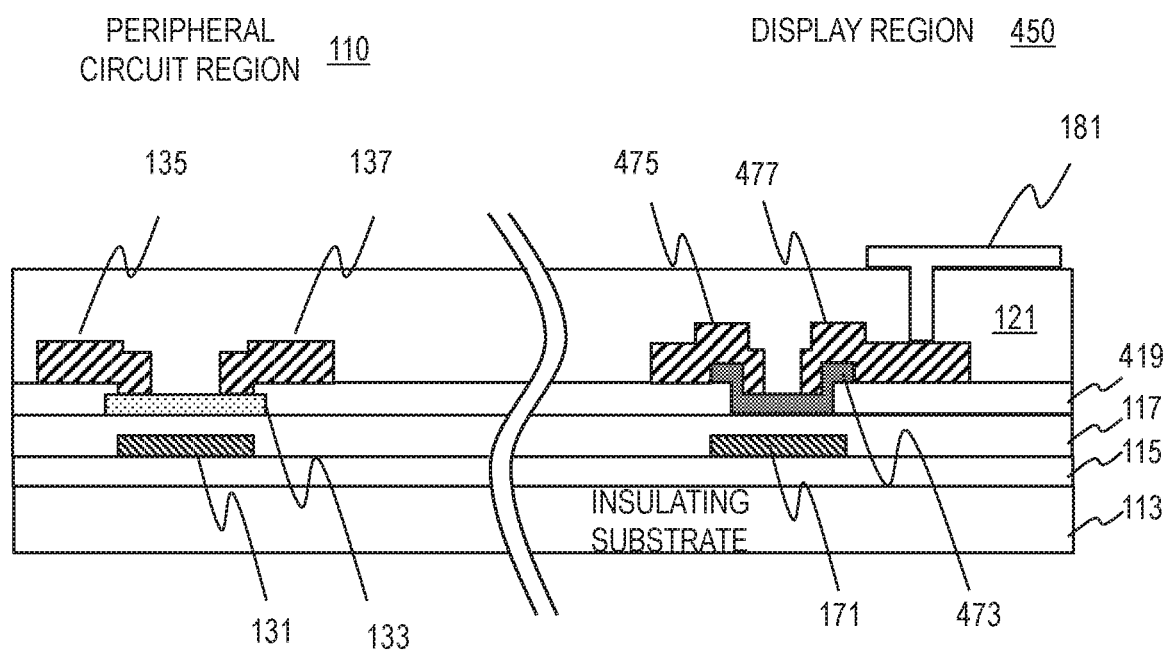
FIG. 9G illustrates a step of a method of manufacturing the TFT substrate illustrated in FIG. 8.

Next, the method forms an interlayer insulating layer 121 by CVD to cover the source/drain electrodes 135, 137, 475, 477, the first oxide semiconductor film 133, the second oxide semiconductor film 473, and the second insulating layer 419, and further opens a via hole in the interlayer insulating layer 121 by photolithography and etching to expose a part of the top face of the source/drain electrode 477 as illustrated in FIG. 9G. Further, the method forms a pixel electrode 181 on the interlayer insulating layer 121 as well as a via for connecting the pixel electrode 181 and the source/drain electrode 477 in the interlayer insulating layer 121. Specifically, the method forms an ITO film by sputtering and patterns the ITO film by photolithography and etching.

As illustrated in FIG. 9C, in forming the second oxide semiconductor film 473, the first oxide semiconductor film 133 is covered with the second insulating layer 419. Accordingly, the first oxide semiconductor film 133 is free from the effect of forming and patterning the second oxide semiconductor film 473. For this reason, desirable oxide semiconductor materials can be employed for the first oxide semiconductor film 133 and the second oxide semiconductor film 473.

The first oxide semiconductor TFT, together with or instead of the second oxide semiconductor TFT, can have a structure like the structure of the second oxide semiconductor TFT 470. For example, a third insulating layer having an opening can be provided between the first insulating layer and the second insulating layer. The first oxide semiconductor film of the first oxide semiconductor TFT can be formed in such a manner that a part is located above and in contact with the first insulating layer within the opening in the third insulating layer and another part is located above and in contact with the third insulating layer outside the opening. The third insulating layer is the uppermost insulating layer among the insulating layers located lower than and in contact with the first oxide semiconductor film.

Embodiment 5

Configuration of TFT Substrate

Figure 10:
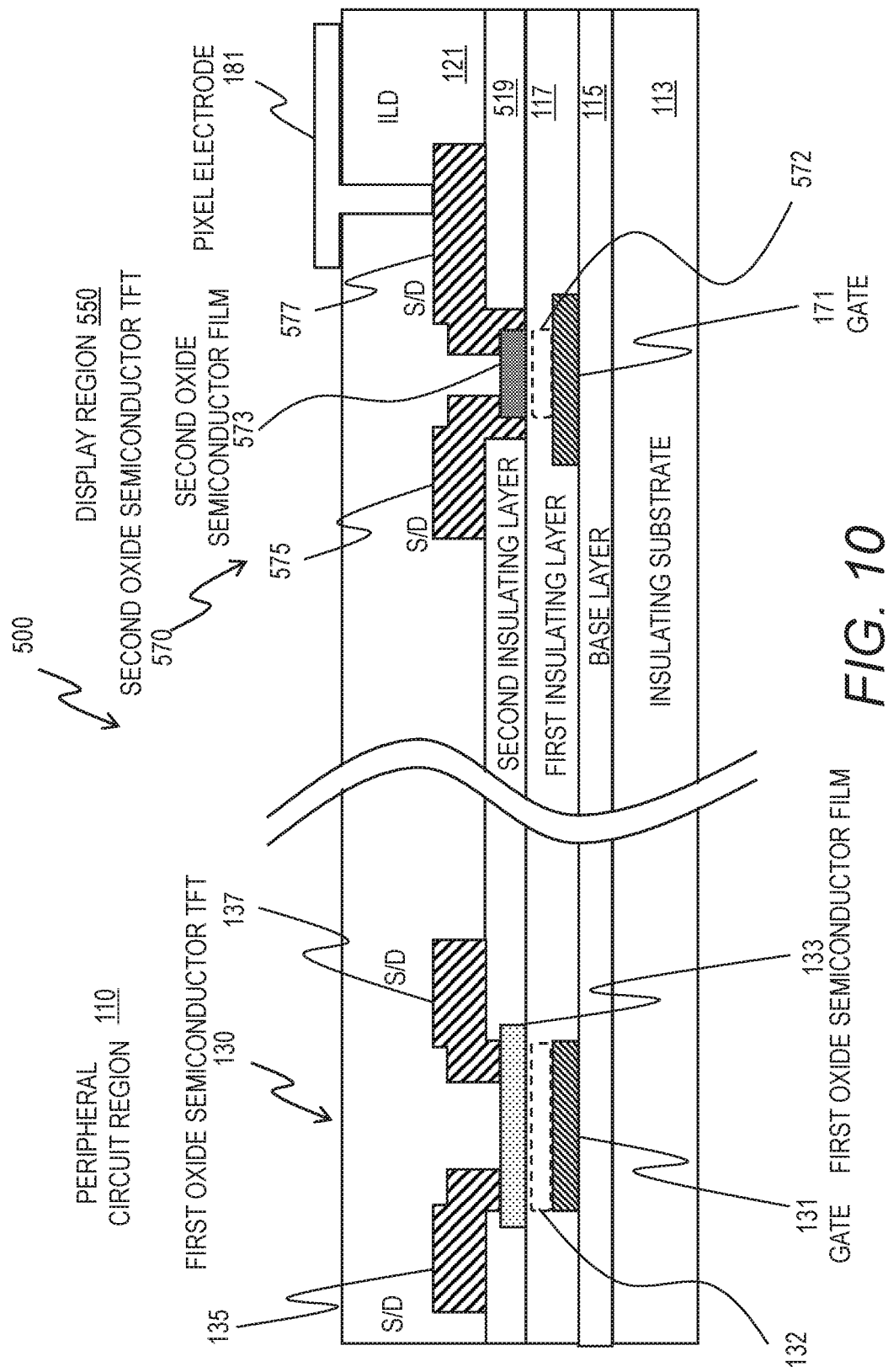
FIG. 10 schematically illustrates a cross-section of still another configuration example of a TFT substrate for a liquid crystal display panel.

Hereinafter, still another configuration example of a TFT substrate and a method of manufacturing the TFT substrate are described. FIG. 10 schematically illustrates a cross-section of a configuration example of another TFT substrate 500 for a liquid crystal display panel. In the following, differences from the configuration example illustrated in FIG. 2 are mainly described.

The TFT substrate 500 includes a first oxide semiconductor TFT 130 in a peripheral circuit region 110 and a second oxide semiconductor TFT 570 in a display region 550. The configuration of the first oxide semiconductor TFT 130 is the same as the configuration in FIG. 2. The second oxide semiconductor TFT 570 is different in the shapes of the second oxide semiconductor film 573, the gate insulating film 572, and the source/drain electrodes 575, 577 from the second oxide semiconductor TFT 170 in the configuration example illustrated in FIG. 2.

The second insulating layer 519 provided above and in contact with the first insulating layer 117 has an opening. The second oxide semiconductor film 573 is provided in the opening. The second oxide semiconductor film 573 is in contact with the first insulating layer 117 within the opening in the second insulating layer 519. The end of the second oxide semiconductor film 573 is distant from the inner wall of the opening.

The gate insulating film 572 has a single layer structure and is a part of the first insulating layer 117. Thinning the gate insulating film 572 enhances the driving ability of the second oxide semiconductor TFT 570. The source/drain electrodes 575 and 577 are in contact with a part of the second oxide semiconductor film 573 including the end thereof. The source/drain electrodes 575 and 577 are in contact with the end face and the top face of the second oxide semiconductor film 573. Such a contact structure achieves low contact resistance between the second oxide semiconductor film 573 and the source/drain electrodes 575, 577.

Method of Manufacturing TFT Substrate

Figure 11A:
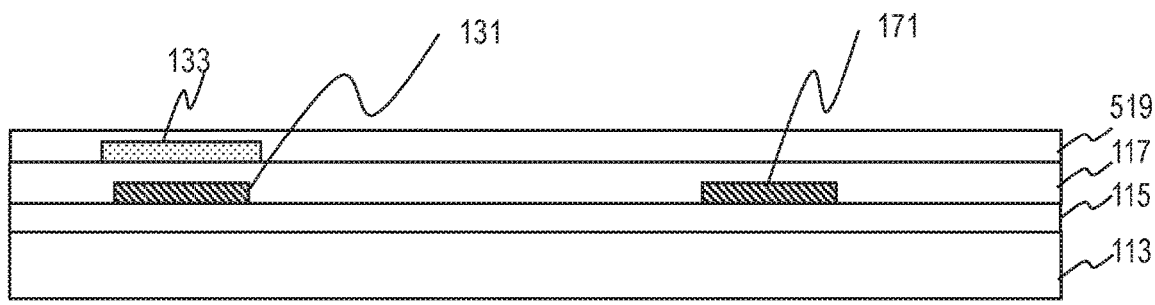
FIG. 11A illustrates a step of a method of manufacturing the TFT substrate illustrated in FIG. 10.

An example of a method of manufacturing the TFT substrate 500 illustrated in FIG. 10 is described. After performing the steps described with reference to FIGS. 3A and 3B, the method forms a second insulating layer 519 by CVD to cover the first oxide semiconductor film 133 as illustrated in FIG. 11A.

Figure 11B:
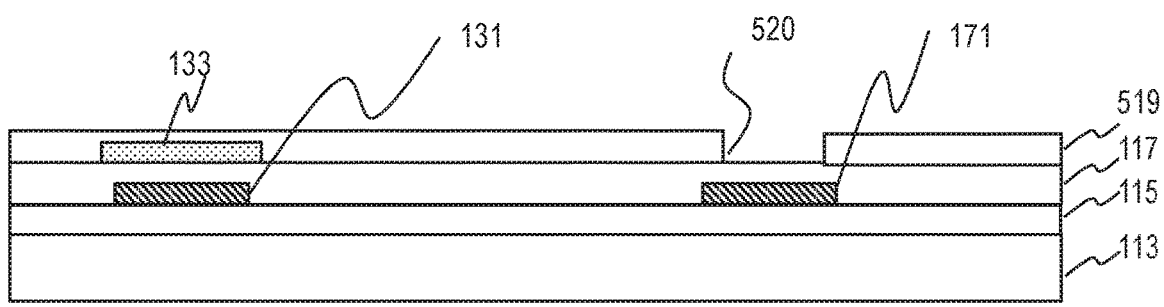
FIG. 11B illustrates a step of a method of manufacturing the TFT substrate illustrated in FIG. 10.
Figure 11C:
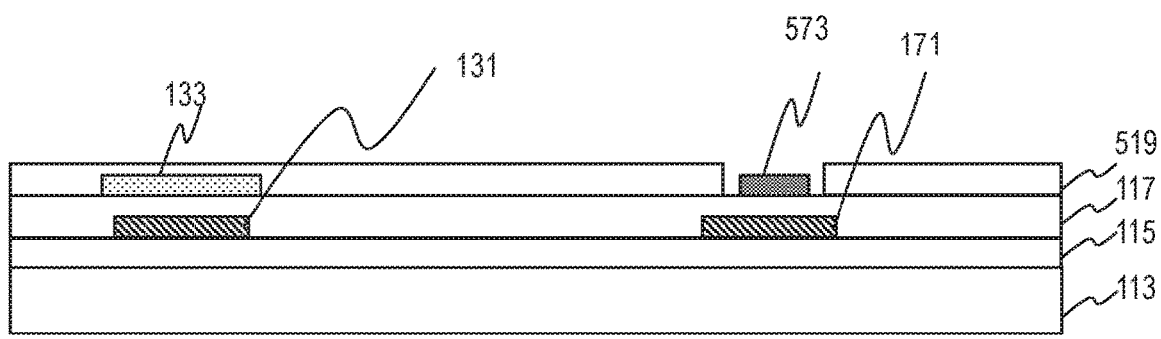
FIG. 11C illustrates a step of a method of manufacturing the TFT substrate illustrated in FIG. 10.

Next, the method opens an opening 520 in the second insulating layer 519 by photolithography and etching as illustrated in FIG. 11B. The top face of the first insulating layer 117 is exposed in the opening 520. Next, the method forms an oxide semiconductor layer (second oxide semiconductor layer) including a second oxide semiconductor film 573 on the second insulating layer 519 as illustrated in FIG. 11C. Specifically, the method forms an oxide semiconductor layer by sputtering and patterns the oxide semiconductor layer by photolithography and etching. As a result, a pattern of the oxide semiconductor film is formed. The second oxide semiconductor film 573 is provided above and in contact with the first insulating layer 117 within the opening 520 in the second insulating layer 519.

Figure 11D:
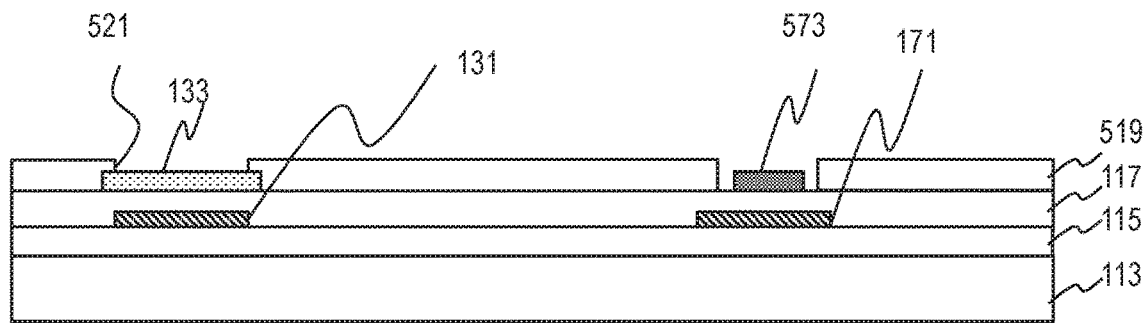
FIG. 11D illustrates a step of a method of manufacturing the TFT substrate illustrated in FIG. 10.

Next, the method opens an opening 521 in the second insulating layer 519 by photolithography and etching as illustrated in FIG. 11D. The opening 521 is formed to expose the top face of the first oxide semiconductor film 133 within the opening. In this example, the end face of the first oxide semiconductor film 133 is not exposed in the opening 521 but can be exposed.

Figure 11E:
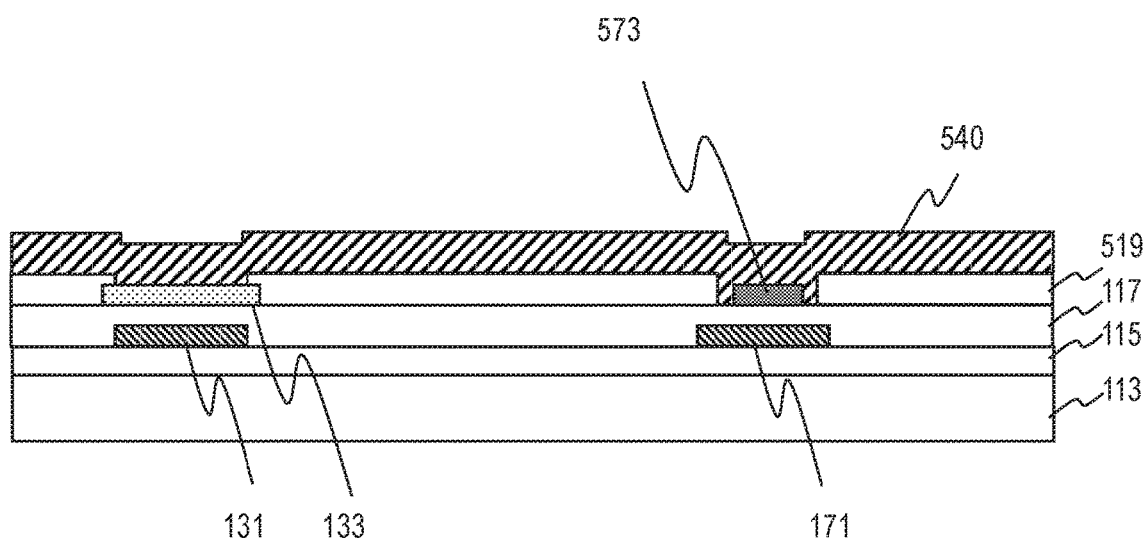
FIG. 11E illustrates a step of a method of manufacturing the TFT substrate illustrated in FIG. 10.
Figure 11F:
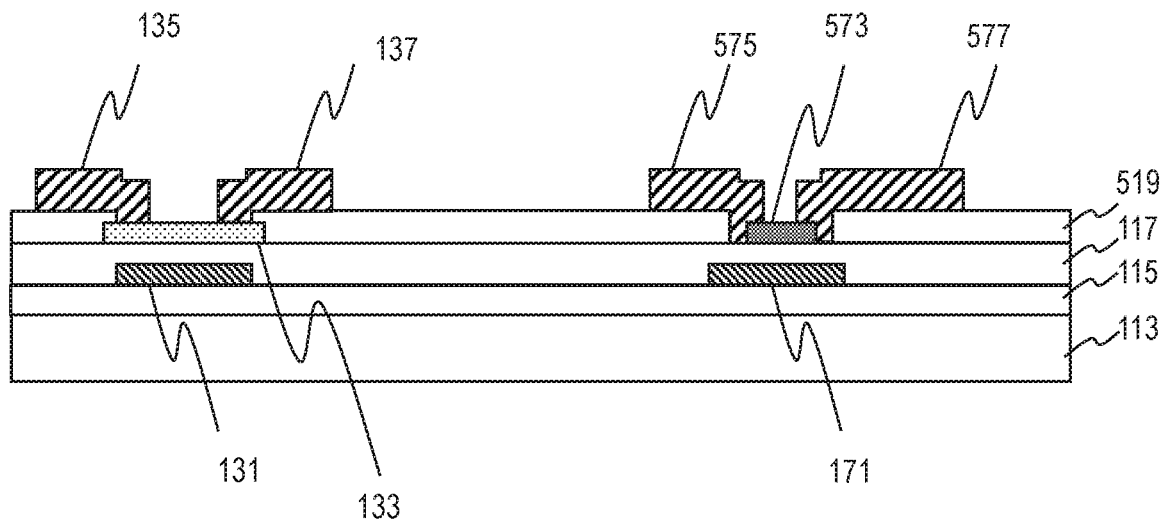
FIG. 11F illustrates a step of a method of manufacturing the TFT substrate illustrated in FIG. 10.

Next, the method forms a metal layer (source/drain electrode layer) 540 including source/drain electrodes 135, 137, 575, and 577 by sputtering as illustrated in FIG. 11E. The metal layer 540 covers the second insulating layer 519, the first oxide semiconductor film 133, and the second oxide semiconductor film 573. The metal layer 540 fills the opening 521 in the second insulating layer 519 and contacts the top face of the first oxide semiconductor film 133. Next, the method patterns the metal layer 540 by photolithography and etching to form the source/drain electrodes 135, 137, 575, and 577 as illustrated in FIG. 11F.

Figure 11G:
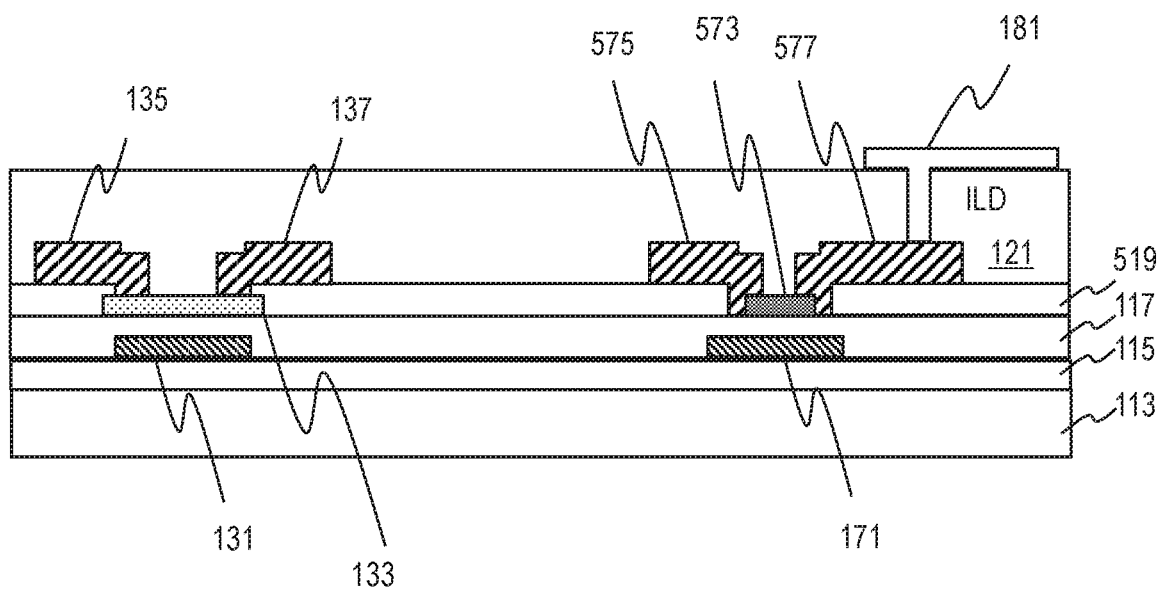
FIG. 11G illustrates a step of a method of manufacturing the TFT substrate illustrated in FIG. 10.

Next, the method forms an interlayer insulating layer 121 by CVD to cover the source/drain electrodes 135, 137, 575, 577, the first oxide semiconductor film 133, the second oxide semiconductor film 573, and the second insulating layer 519, and further opens a via hole in the interlayer insulating layer 121 by photolithography and etching to expose a part of the top face of the source/drain electrode 577 as illustrated in FIG. 11G. Further, the method forms a pixel electrode 181 on the interlayer insulating layer 121 as well as a via for connecting the pixel electrode 181 and the source/drain electrode 577 in the interlayer insulating layer 121. Specifically, the method forms an ITO film by sputtering and patterns the ITO film by photolithography and etching.

As illustrated in FIG. 11C, in forming the second oxide semiconductor film 573, the first oxide semiconductor film 133 is covered with the second insulating layer 519. Accordingly, the first oxide semiconductor film 133 is free from the effect of forming and patterning the second oxide semiconductor film 573. For this reason, desirable oxide semiconductor materials can be employed for the first oxide semiconductor film 133 and the second oxide semiconductor film 573.

Embodiment 6

In the display region (pixel circuits), oxide semiconductor TFTs having a wide bandgap account for the majority (over half) of the TFTs for high reliability. In the peripheral circuits, oxide semiconductor TFTs having high mobility account for the majority (over half) for small circuit size. However, some of the oxide semiconductor TFTs in the display region can be oxide semiconductor TFTs having high mobility and some of the oxide semiconductor TFTs in the peripheral circuits can be oxide semiconductor TFTs having a wide bandgap depending on the characteristics demanded for individual oxide semiconductor TFTs.

An oxide semiconductor TFT expected to mainly receive a negative gate bias (gate voltage) can attain high reliability by employing an oxide semiconductor TFT having a wide bandgap. In contrast, an oxide semiconductor TFT expected to mainly receive a positive gate bias can contribute to a small circuit size by employing an oxide semiconductor TFT having high mobility.

The oxide semiconductor TFT that mainly receives a negative gate bias is supplied with a negative gate bias for a time longer than the time a positive gate bias is supplied during the operating time of the device. The negative gate bias turns off the oxide semiconductor TFT and the positive gate bias turns on the oxide semiconductor TFT. The zero gate-bias is neither a negative gate bias nor a positive gate bias.

A TFT in a peripheral circuit contributes to small circuit size by employing an oxide semiconductor TFT having high mobility if high driving ability is required for the TFT and contributes to high reliability by employing an oxide semiconductor TFT having a wide bandgap if such a high driving ability is not required.

In the peripheral circuits, a TFT for an electrostatic discharge protection element or a testing TFT is a diode-connected TFT or a TFT having a floating gate to be used as a highly-resistive element. Such TFTs do not require high driving ability; if their driving abilities are too high, the TFTs could interfere with the overall operation of the peripheral circuit. For this reason, an oxide semiconductor TFT having a wide bandgap can be used as an electrostatic discharge protection element or a testing TFT.

Figure 12:
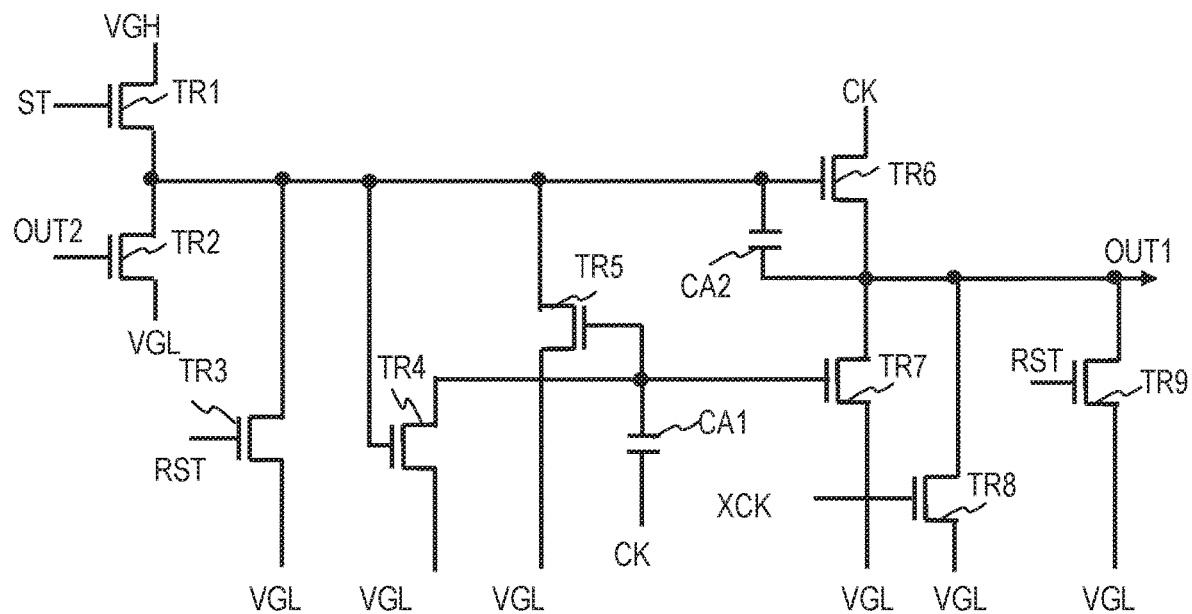
FIG. 12 illustrates an example of a circuit of one stage of a shift register.

FIG. 12 illustrates an example of a circuit of one stage of a shift register. The shift register includes transistors TR1 to TR9 and capacitors CA1 and CA2. The potential VGH is a high power-supply potential and the potential VGL is a low power-supply potential. The signal ST is a start pulse or an output from the previous stage. The signal OUT1 is an output. The signal OUT2 is a feedback signal from the next stage. The signal RST is a reset signal. The signal CK is a clock signal and the signal XCK is an inversion clock signal.

In the circuit illustrated in FIG. 12, the transistor TR1 is a transistor that mainly receives a negative gate bias. Accordingly, the transistor TR1 can have high reliability by employing an oxide semiconductor TFT having a wide bandgap. On the other hand, the transistors TR2 to TR9 are transistors that mainly receive a positive gate bias. Accordingly, a small circuit size is attained by employing oxide semiconductor TFTs having high mobility for these transistors TR2 to TR9. Particularly, the transistor TR6 is a driving transistor for the output to the next stage and a data line; employing an oxide semiconductor TFT having high mobility for the transistor TR6 effectively contributes to downsizing of the circuit.

Figure 13:
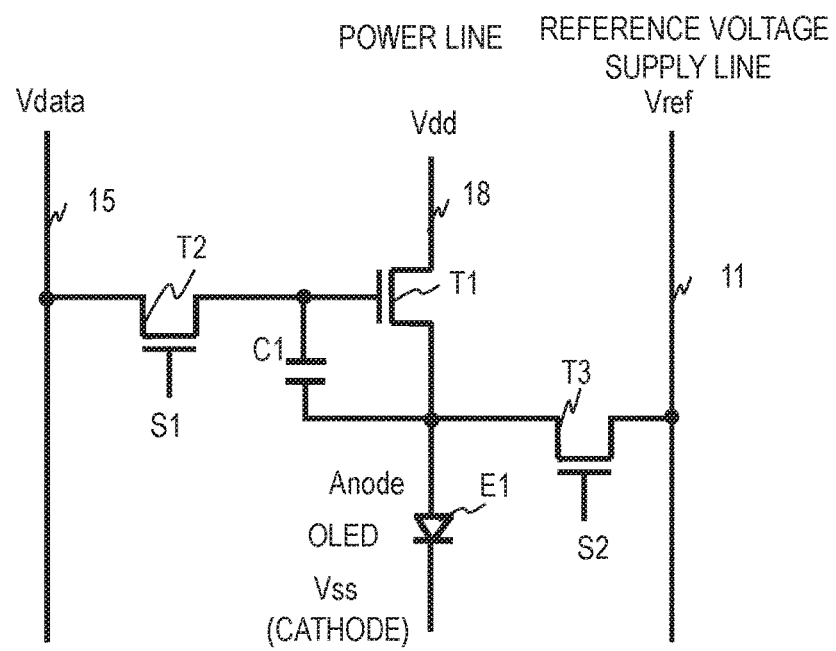
FIG. 13 illustrates an example of a pixel circuit for an OLED display device.

FIG. 13 illustrates an example of a pixel circuit for an OLED display device. The pixel circuit controls electric current to be supplied to the anode electrode of the OLED element E1. The pixel circuit includes a driving transistor T1, a selection transistor T2, a control transistor T3, and a storage capacitor C1. The pixel circuit controls light emission of the OLED element E1. The transistors T1 to T3 in the example of FIG. 13 are n-channel type of oxide semiconductor TFTs.

The selection transistor T2 is a switch for selecting the pixel. The gate terminal of the selection transistor T2 receives a scanning signal S1. One of its source/drain terminals is connected with a data line 15. The other source/drain terminal is connected with the gate terminal of the driving transistor T1.

The driving transistor T1 is a transistor for driving the OLED element E1. The gate terminal of the driving transistor T1 is connected with a source/drain terminal of the selection transistor T2. One of the source/drain terminals of the driving transistor T1 is connected with a power line (Vdd) 18. The other source/drain terminal is connected with the source terminal of the control transistor T3. The storage capacitor C1 is provided between the gate terminal and a source/drain terminal of the driving transistor T1.

When the selection transistor T2 is turned on, the data voltage supplied through the data line 15 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The control transistor T3 controls the electric connection between the reference voltage supply line 11 for supplying a reference voltage Vref and the anode of the OLED element E1. A control signal S2 is supplied to the gate terminal of the control transistor T3 for this control. The control transistor T3 can be used for various purposes. The control transistor T3 can be used to reset the anode electrode of the OLED element E1 once to a sufficiently low voltage that is lower than the black signal level in order to prevent crosstalk between OLED element E1 caused by the leakage current.

The control transistor T3 can also be used to measure a characteristic of the driving transistor T1. For example, the voltage-current characteristic of the driving transistor T1 can be accurately measured by measuring the current flowing from the power line 18 to the reference voltage supply line 11 under the bias conditions selected so that the driving transistor T1 will operate in the saturated region and the control transistor T3 will operate in the linear region. If the differences in voltage-current characteristic among the driving transistors T1 for individual pixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 11 when the driving transistor T1 is off and the control transistor T3 is operating in the linear region. In the case where the OLED element E1 is deteriorated because of long-term use, for example, if the deterioration is compensated for by generating a data signal at an external circuit, the display device can have a long life spun.

In the pixel circuit in FIG. 13, the transistors T2 and T3 employ oxide semiconductor TFTs having a wide bandgap. These transistors are mainly supplied with a negative gate bias and exhibit high reliability. On the other hand, the driving transistor T1 employ an oxide semiconductor TFT having high mobility. The driving transistor T1 is mainly supplied with a positive gate bias and contributes to a small transistor size. In a liquid crystal display panel, a switching TFT for controlling the input of a signal to a pixel electrode employs an oxide semiconductor TFT having a wide bandgap. The switching TFT is mainly supplied with a negative gate bias and exhibits high reliability.

As described above, a display device attains high reliability and a slim bezel by appropriate choices between an oxide semiconductor TFT having a wide bandgap and an oxide semiconductor TFT having high mobility.

Embodiment 7

Configuration of TFT Substrate

Figure 14:
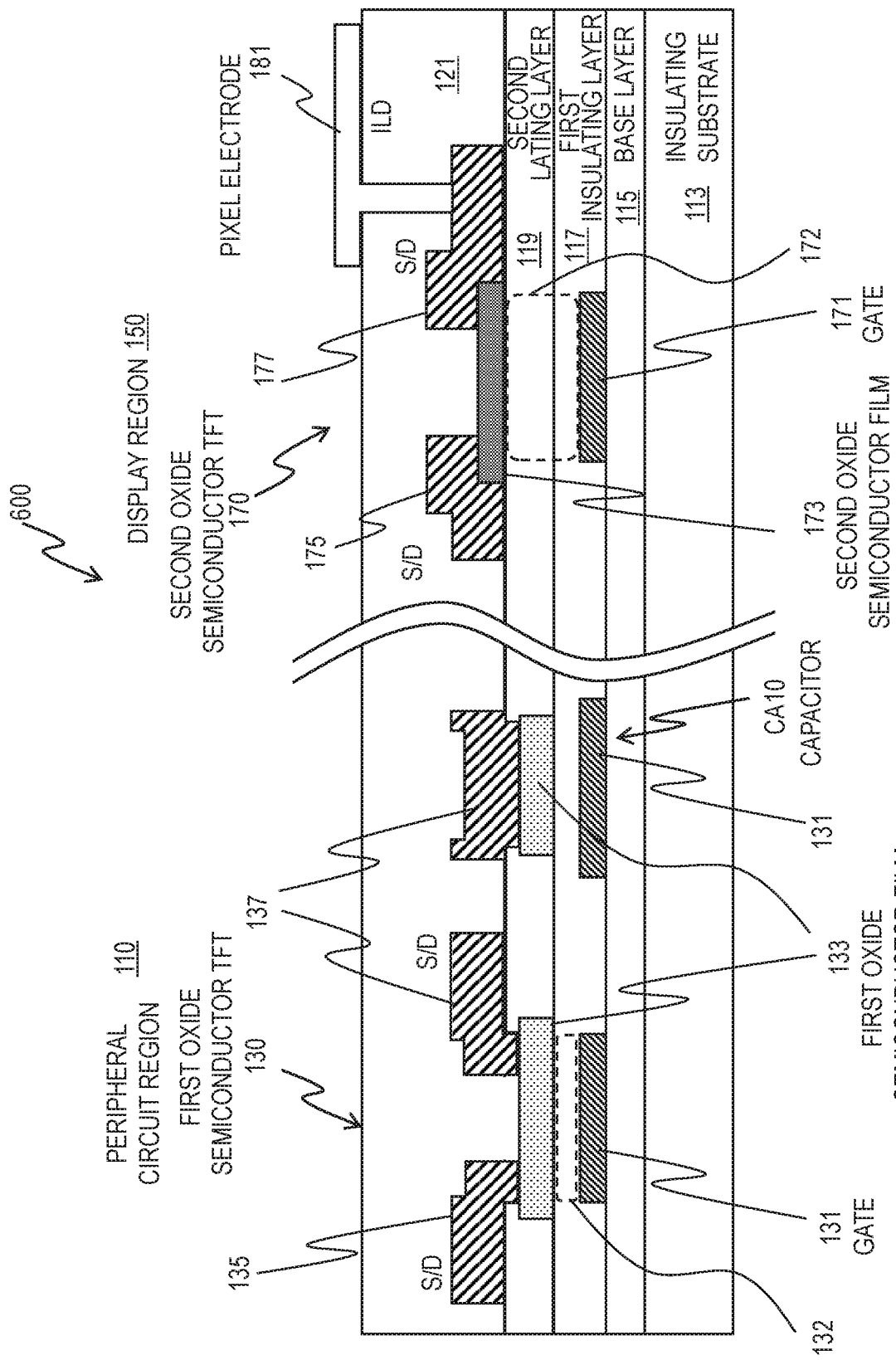
FIG. 14 schematically illustrates a cross-section of still another configuration example of a TFT substrate for a liquid crystal display panel.

Hereinafter, still another configuration example of a TFT substrate is described. FIG. 14 schematically illustrates a cross-section of a configuration example of another TFT substrate 600 for a liquid crystal display panel. In the following, differences from the configuration example illustrated in FIG. 2 are mainly described.

The TFT substrate 600 includes a first oxide semiconductor TFT 130 and a capacitor CA 10 in a peripheral circuit region 110 and a second oxide semiconductor TFT 170 in a display region 150. The first oxide semiconductor TFT 130 and the second oxide semiconductor TFT 170 have the same configurations as the corresponding ones illustrated in FIG. 2 and the difference from FIG. 2 is that the capacitor CA 10 is added.

The capacitor CA 10 is composed of a gate electrode 131, a first insulating layer 117 provided above the gate electrode 131, and a first oxide semiconductor film 133 provided above the first insulating layer 117. The first oxide semiconductor film 133 is in contact with a source/drain electrode 137 in an opening provided in the second insulating layer 119.

The first insulating layer 117 is a gate insulating film of the first oxide semiconductor TFT 130. This gate insulating film is thinner than the gate insulating film of the second oxide semiconductor TFT 170 of a laminate of the first insulating layer 117 and the second insulating layer 119 and accordingly, it can have a larger capacitance. For this reason, the area of the capacitor CA 10 can be made smaller.

The TFT substrate 600 illustrated in FIG. 14 can be manufactured by the same steps as illustrated in FIGS. 3A to 3H and therefore, description of the manufacturing method is omitted here.

Embodiment 8

Configuration of TFT Substrate

Figure 15:
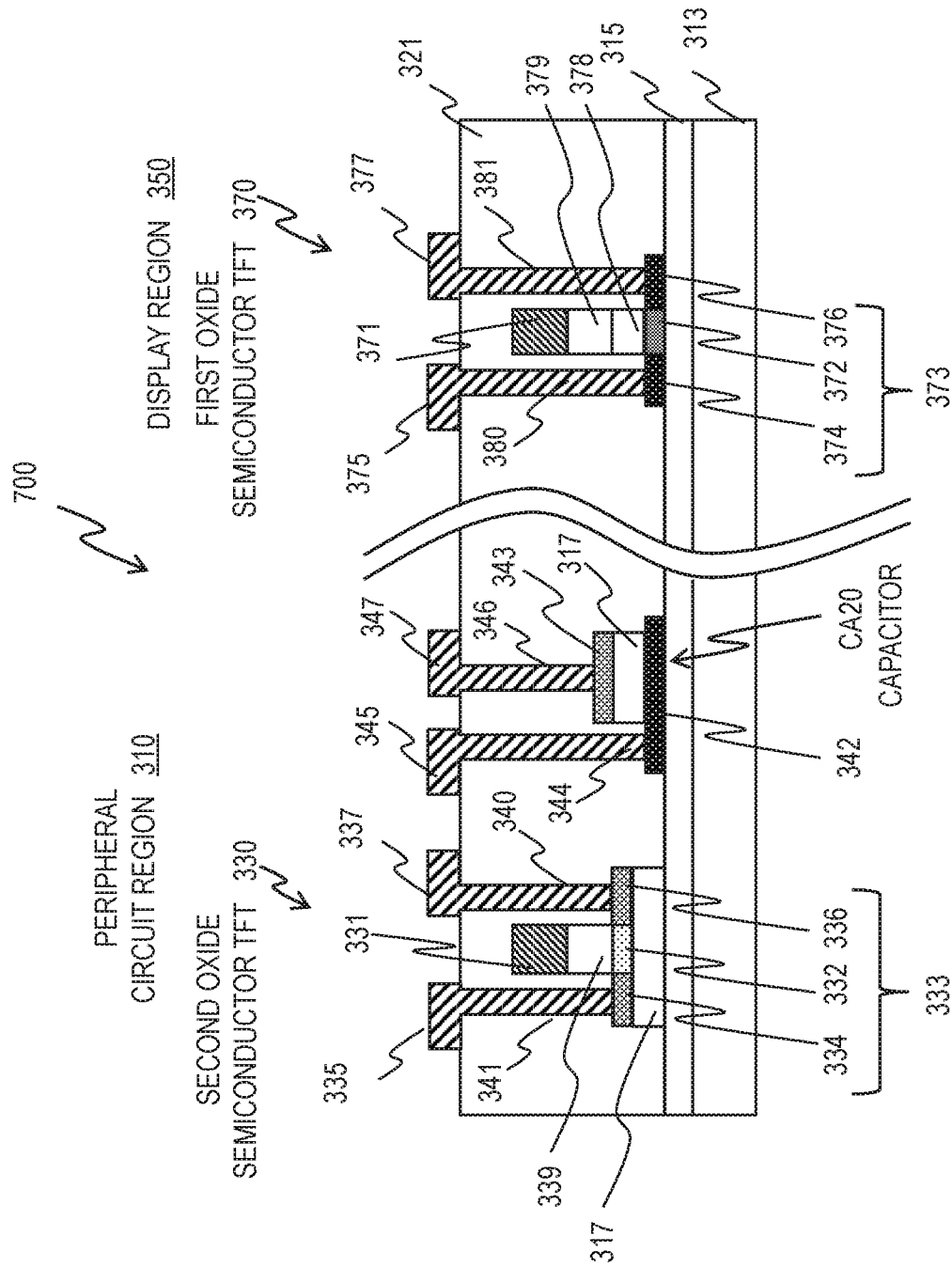
FIG. 15 schematically illustrates a cross-section of still another configuration example of a TFT substrate for a liquid crystal display panel.

Hereinafter, still another configuration example of a TFT substrate is described. FIG. 15 schematically illustrates a cross-section of a configuration example of another TFT substrate 700 for a liquid crystal display panel. In the following, differences from the configuration example illustrated in FIG. 6 are mainly described.

The TFT substrate 700 includes a second oxide semiconductor TFT 330 and a capacitor CA 20 in a peripheral circuit region 310 and a first oxide semiconductor TFT 370 in a display region 350. The first oxide semiconductor TFT 370 and the second oxide semiconductor TFT 330 have the same configurations as the corresponding ones illustrated in FIG. 6 and the difference from FIG. 6 is that the capacitor CA 20 is added.

The capacitor CA 20 is composed of a first oxide semiconductor film 342 provided above the first insulating layer 315, an insulating film 317 of a part of the second insulating layer, and a second oxide semiconductor film 343 provided above the insulating film 317. The first oxide semiconductor film 342 is made of the same material as the first oxide semiconductor film 373 and reduced in resistance like the source/drain regions 374 and 376 to be one electrode of the capacitor CA 20. The second oxide semiconductor film 343 is made of the same material as the second oxide semiconductor film 333 and reduced in resistance like the source/drain regions 334 and 336 to be the other electrode of the capacitor CA20. Further, the first oxide semiconductor film 342 is connected with a capacitor line 345 through a via 344 and the second oxide semiconductor film 343 is connected with a capacitor line 347 through a via 346.

The insulating film 317 is thinner than the gate insulating film 339 of the second oxide semiconductor TFT 330. As a result, the capacitor CA 20 can have a thin insulating film, compared to the case where a laminate of a lower gate insulating film 378 and an upper gate insulating film 379 is used like the gate insulating film of the first oxide semiconductor TFT 370 or the case where the gate insulating film 339 of the second oxide semiconductor TFT 330 is used and therefore, the capacitor CA 20 can store more electric charges. For this reason, the area of the capacitor CA 20 can be made smaller.

Method of Manufacturing TFT Substrate

Figure 16A:
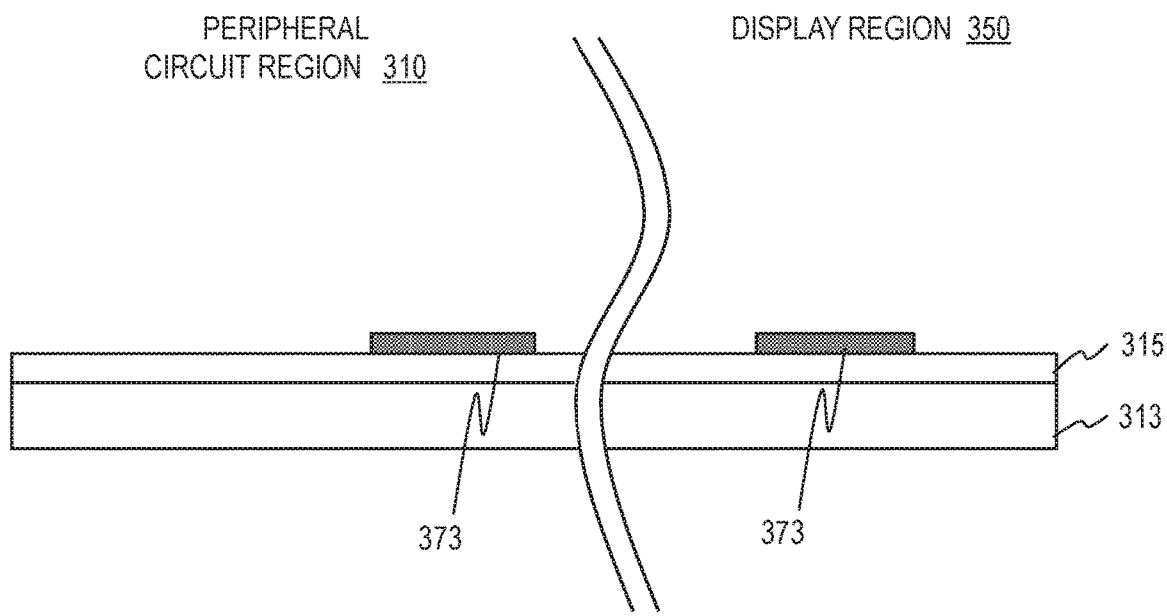
FIG. 16A illustrates a step of a method of manufacturing the TFT substrate illustrated in FIG. 15.

An example of a method of manufacturing the TFT substrate 700 illustrated in FIG. 15 is described. As illustrated in FIG. 16A, the method of manufacturing the TFT substrate 700 forms a first insulating layer 315 of a base layer by CVD on an insulating substrate 313. Next, the method forms an oxide semiconductor layer (first oxide semiconductor layer) including first oxide semiconductor films 373 on the first insulating layer 315. Specifically, the method forms an oxide semiconductor film by sputtering and patterns the oxide semiconductor film by photolithography and etching. As a result, a pattern of the oxide semiconductor film is formed.

Figure 16B:
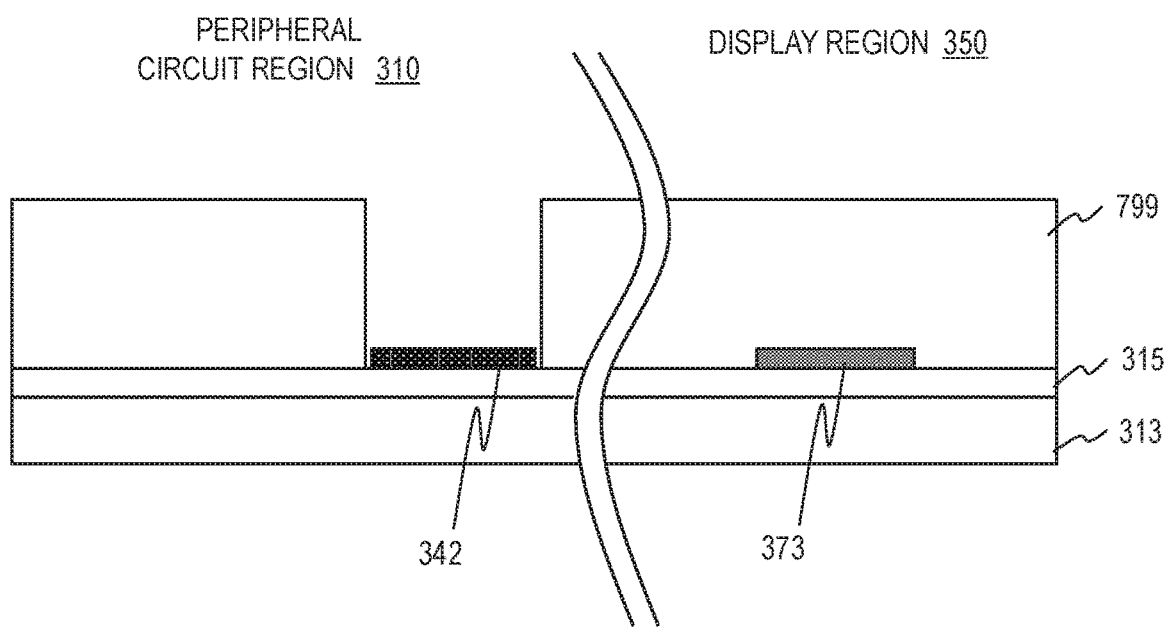
FIG. 16B illustrates a step of a method of manufacturing the TFT substrate illustrated in FIG. 15.

Next, the method forms a resist pattern 799 by photolithography to cover the area except for the first oxide semiconductor film 373 where to provide a capacitor as illustrated in FIG. 16B, and further exposes the substrate to He plasma to reduce the resistance of the first oxide semiconductor film 373. As a result, a first oxide semiconductor film 342 to be an electrode of the capacitor CA20 is prepared.

Figure 16C:
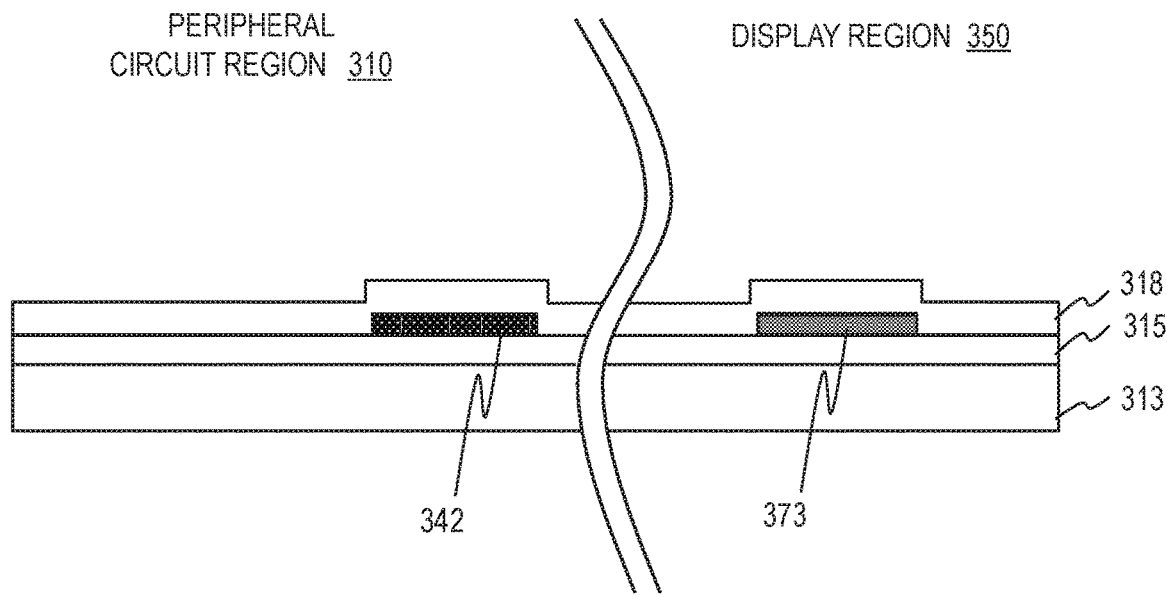
FIG. 16C illustrates a step of a method of manufacturing the TFT substrate illustrated in FIG. 15.

After removing the resist pattern 799, the method forms a second insulating layer 318 by CVD to cover the layer including the first oxide semiconductor films 373 and 342 as illustrated in FIG. 16C. The second insulating layer 318 includes the insulating films 317 and 378 in FIG. 15.

Figure 16D:
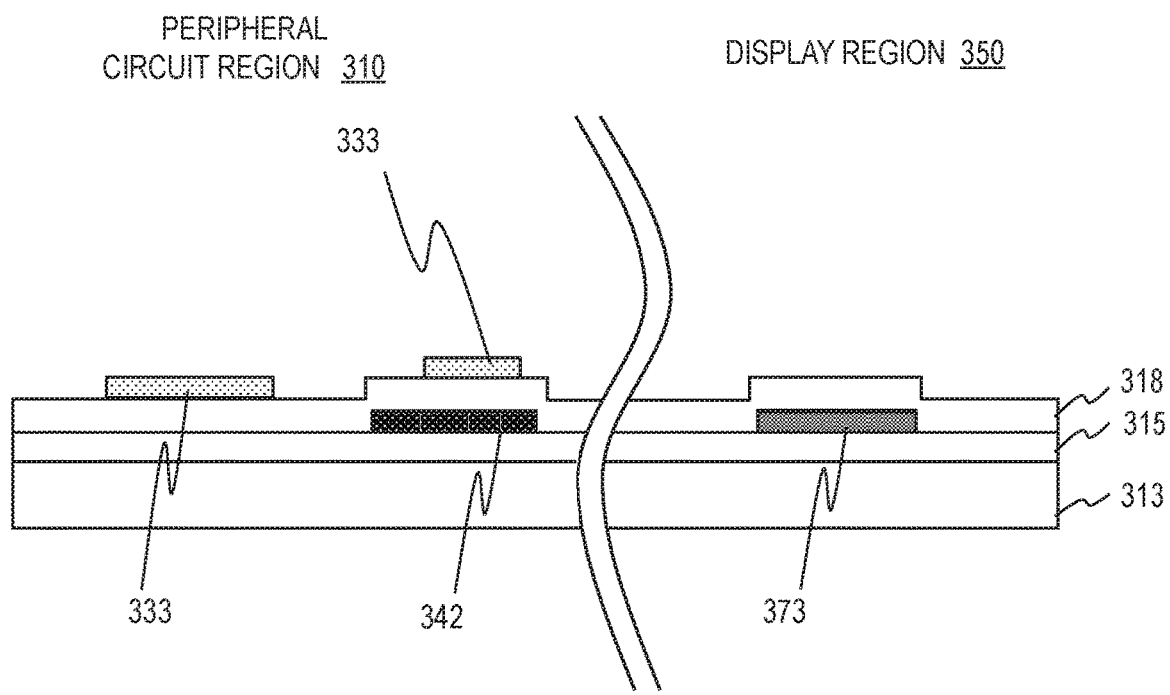
FIG. 16D illustrates a step of a method of manufacturing the TFT substrate illustrated in FIG. 15.

Next, the method forms an oxide semiconductor layer (second oxide semiconductor layer) including second oxide semiconductor films 333 on the second insulating layer 318 as illustrated in FIG. 16D. Specifically, the method forms an oxide semiconductor film by sputtering and patterns the oxide semiconductor film by photolithography and etching. As a result, a pattern of the oxide semiconductor film is formed.

Figure 16E:
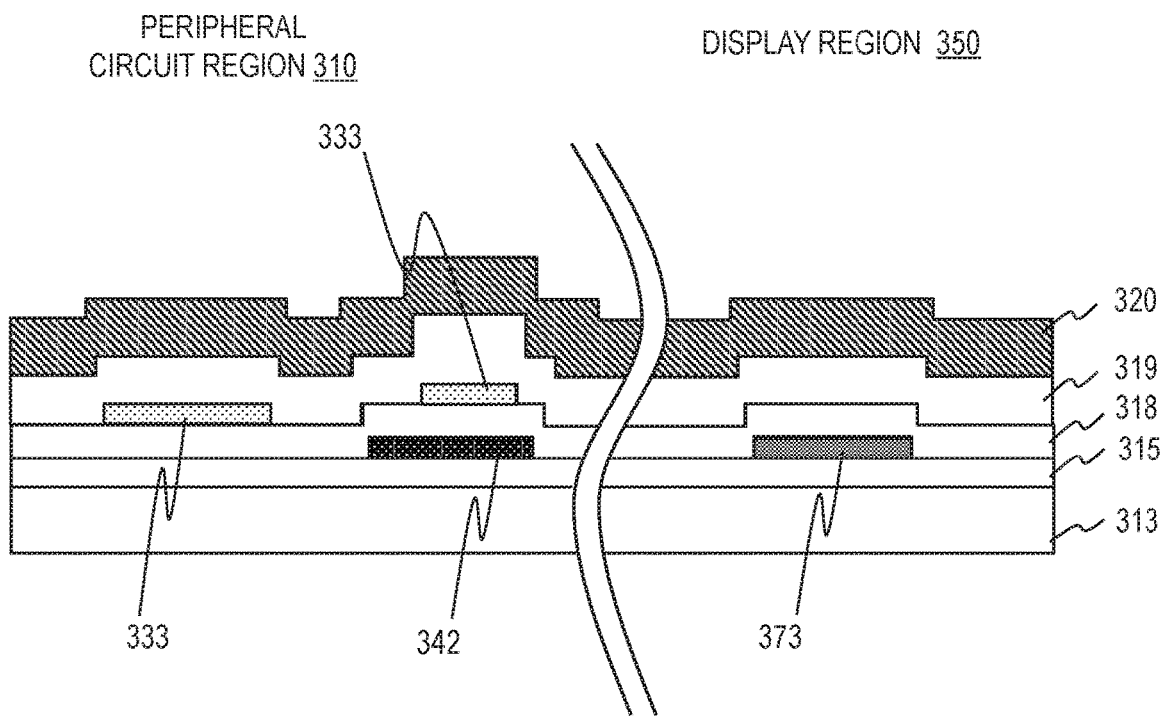
FIG. 16E illustrates a step of a method of manufacturing the TFT substrate illustrated in FIG. 15.

Next, the method forms a third insulating layer 319 by CVD to cover the second oxide semiconductor film 333 and the second insulating layer 318 as illustrated in FIG. 16E. The third insulating layer 319 includes the insulating films 339 and 379 in FIG. 15. Further, the method forms a metal layer (gate electrode layer) 320 including gate electrodes 331 and 371 on the third insulating layer 319 by sputtering.

Figure 16F:
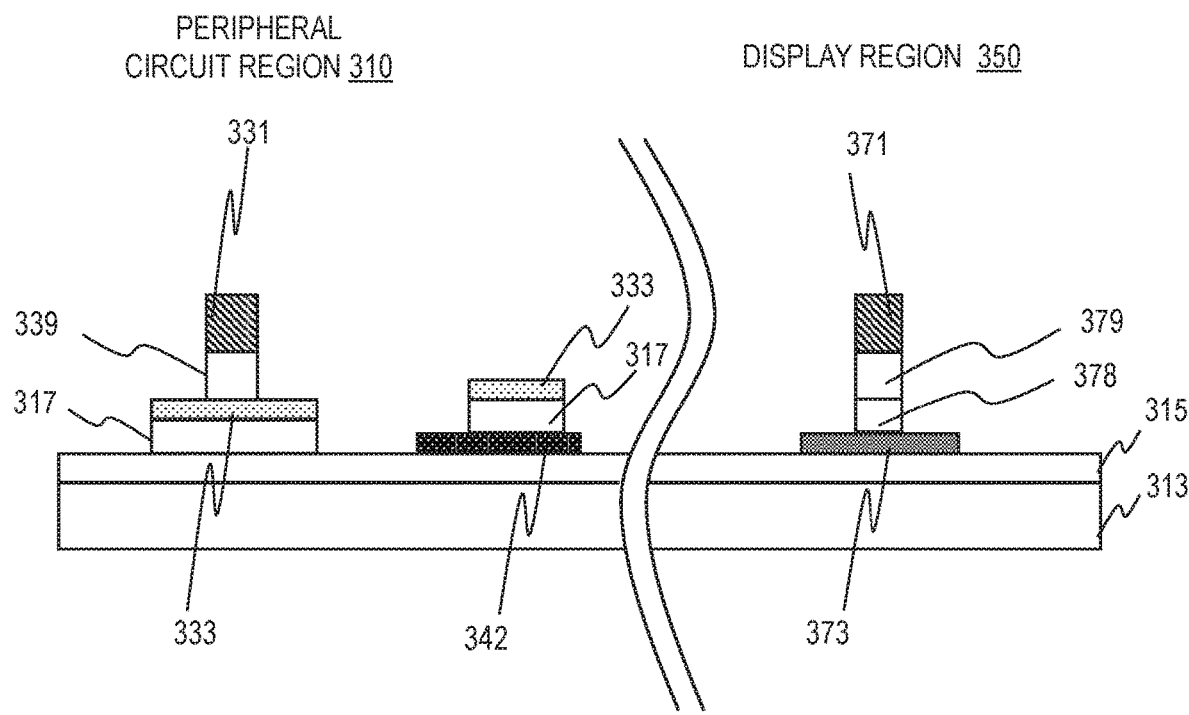
FIG. 16F illustrates a step of a method of manufacturing the TFT substrate illustrated in FIG. 15.
Figure 16G:
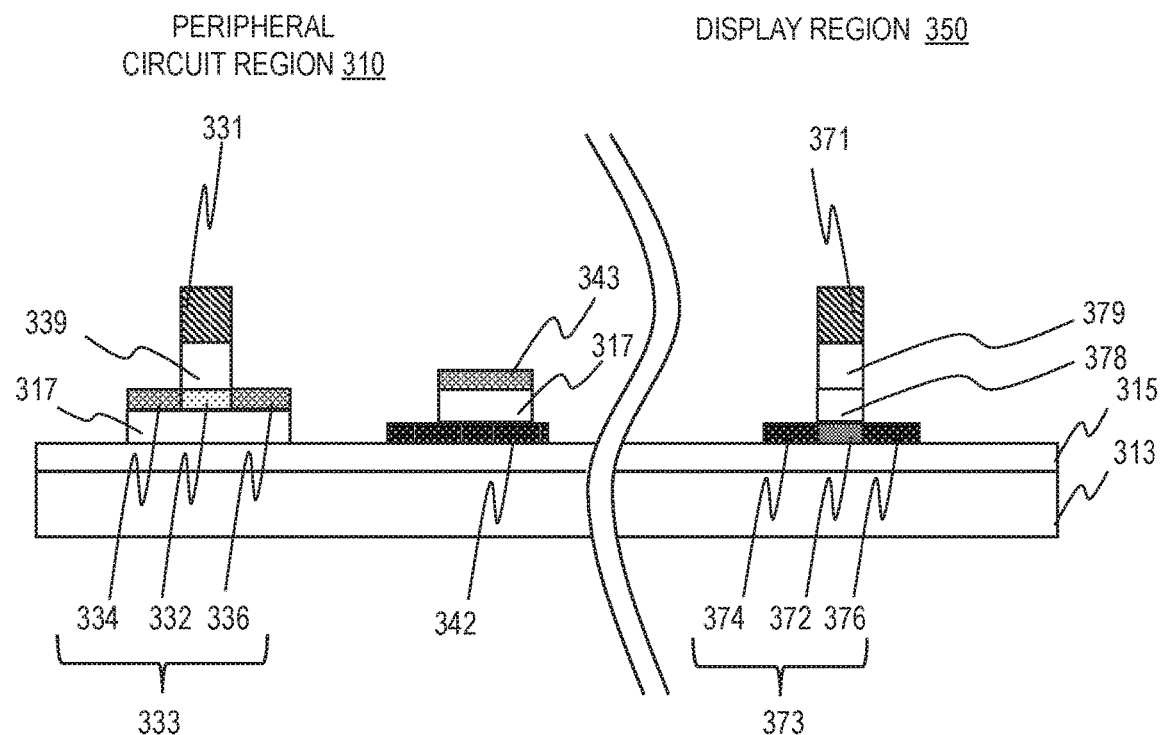
FIG. 16G illustrates a step of a method of manufacturing the TFT substrate illustrated in FIG. 15.

Next, the method etches the second insulating layer 318, the third insulating layer 319, and the gate electrode layer 320 together to prepare insulating films 339, 317, insulating films 379, 378, and gate electrodes 331, 371 as illustrated in FIG. 16F. Next, the method reduces the resistance of the part uncovered with the gate insulating film 339 in the second oxide semiconductor film 333 and the part uncovered with the gate insulating film 378 in the first oxide semiconductor film 373 by exposing these parts to He plasma as illustrated in FIG. 16G. As a result, source/drain regions 334, 336, 374, 376 and a second oxide semiconductor film 343 to be the other electrode of the capacitor CA20 are prepared.

Figure 16H:
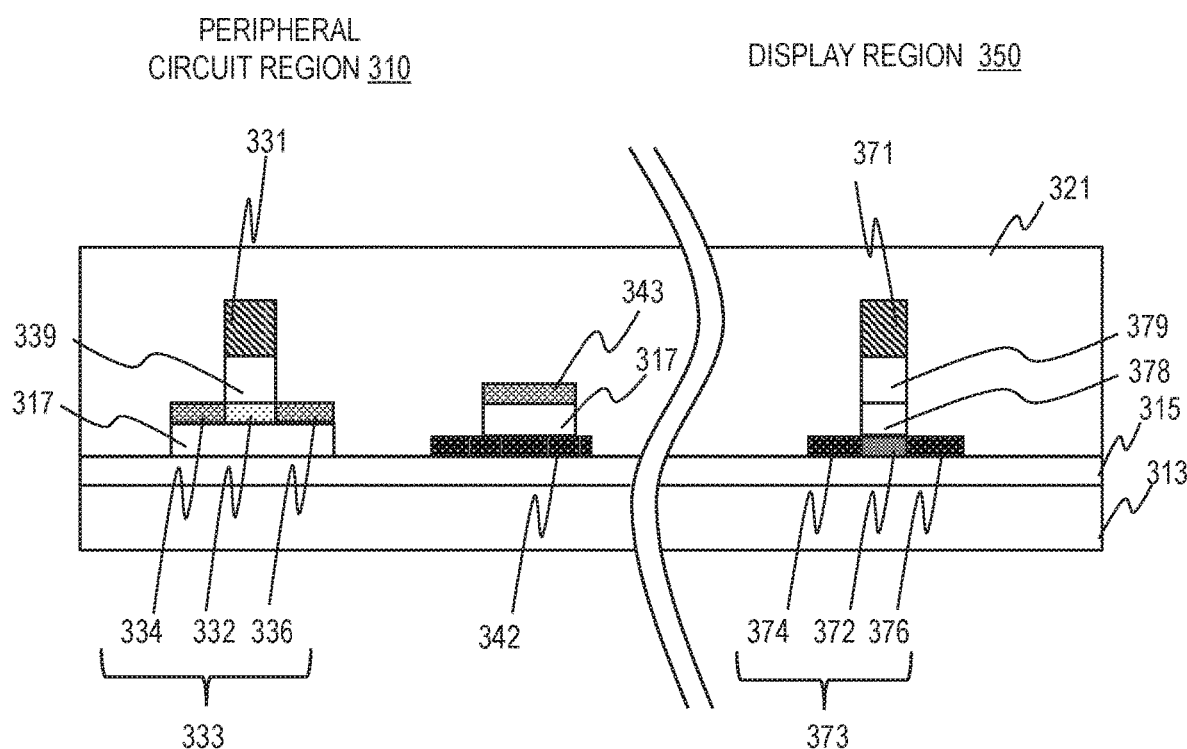
FIG. 16H illustrates a step of a method of manufacturing the TFT substrate illustrated in FIG. 15.

Next, the method forms an interlayer insulating layer 321 by CVD to cover the prepared constituent elements of the first oxide semiconductor TFT 370, the prepared constituent elements of the second oxide semiconductor TFT 330, the prepared constituent elements of the capacitor CA20, and the first insulating layer 315 as illustrated in FIG. 16H.

Figure 16I:
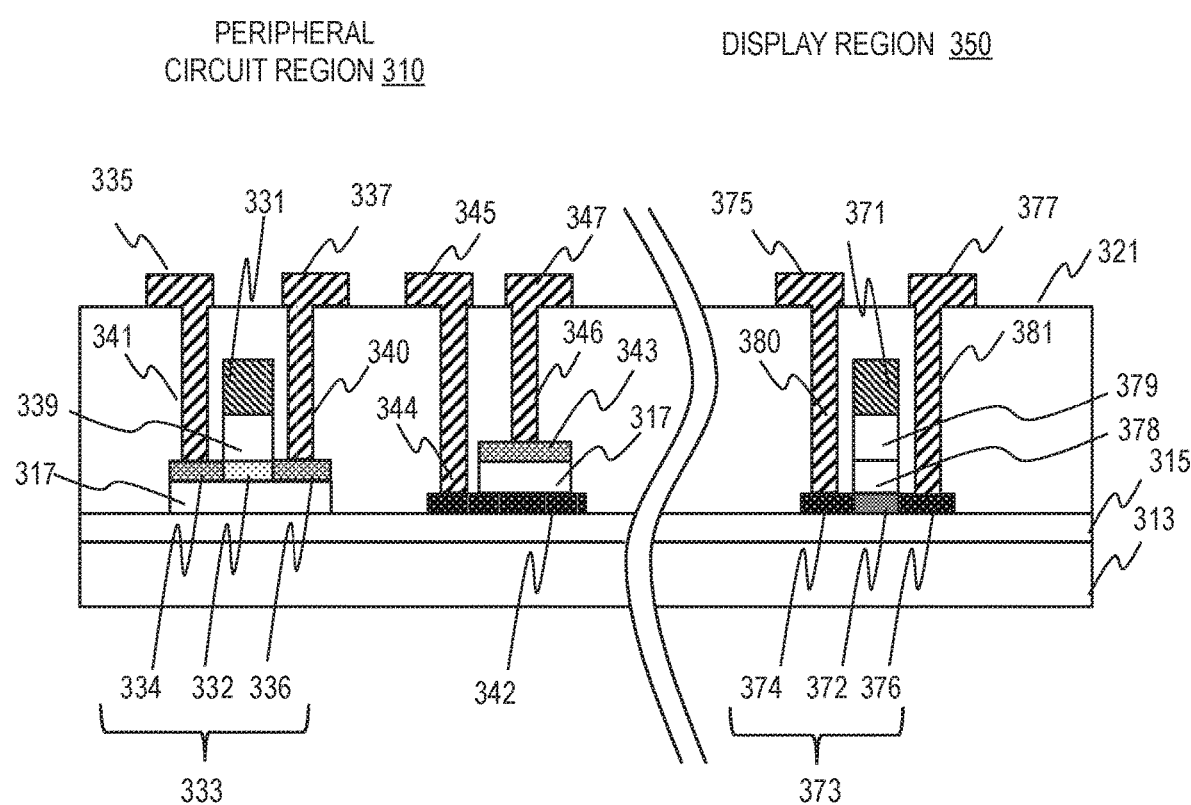
FIG. 16I illustrates a step of a method of manufacturing the TFT substrate illustrated in FIG. 15.

Next, the method opens via holes in the interlayer insulating layer 321 by photolithography and etching and further, prepares source/drain electrodes 335, 337, 375, 377, capacitor lines 345, 347, and the vias 340, 341, 380, 381, 344, 346 as illustrated in FIG. 16I. Specifically, the method forms a metal layer by sputtering on the interlayer insulating layer 321 (including inside the via holes) and forms the source/drain electrodes 335, 337, 375, 377, the capacitor lines 345, 347, and the vias 340, 341, 380, 381, 344, 345 by photolithography and etching. Description of the following formation of the interlayer insulating layer for covering the first oxide semiconductor TFT 370 and the second oxide semiconductor TFT 330 and a pixel electrode is omitted here.

As illustrated in FIG. 16D, in forming the second oxide semiconductor film 333, the first oxide semiconductor film 373 is covered with the second insulating layer 318. Accordingly, the first oxide semiconductor film 373 is free from the effect of forming and patterning the second oxide semiconductor film 333. For this reason, desirable oxide semiconductor materials can be employed for the first oxide semiconductor film 373 and the second oxide semiconductor film 333.

Embodiment 9

Configuration of TFT Substrate

Figure 17:
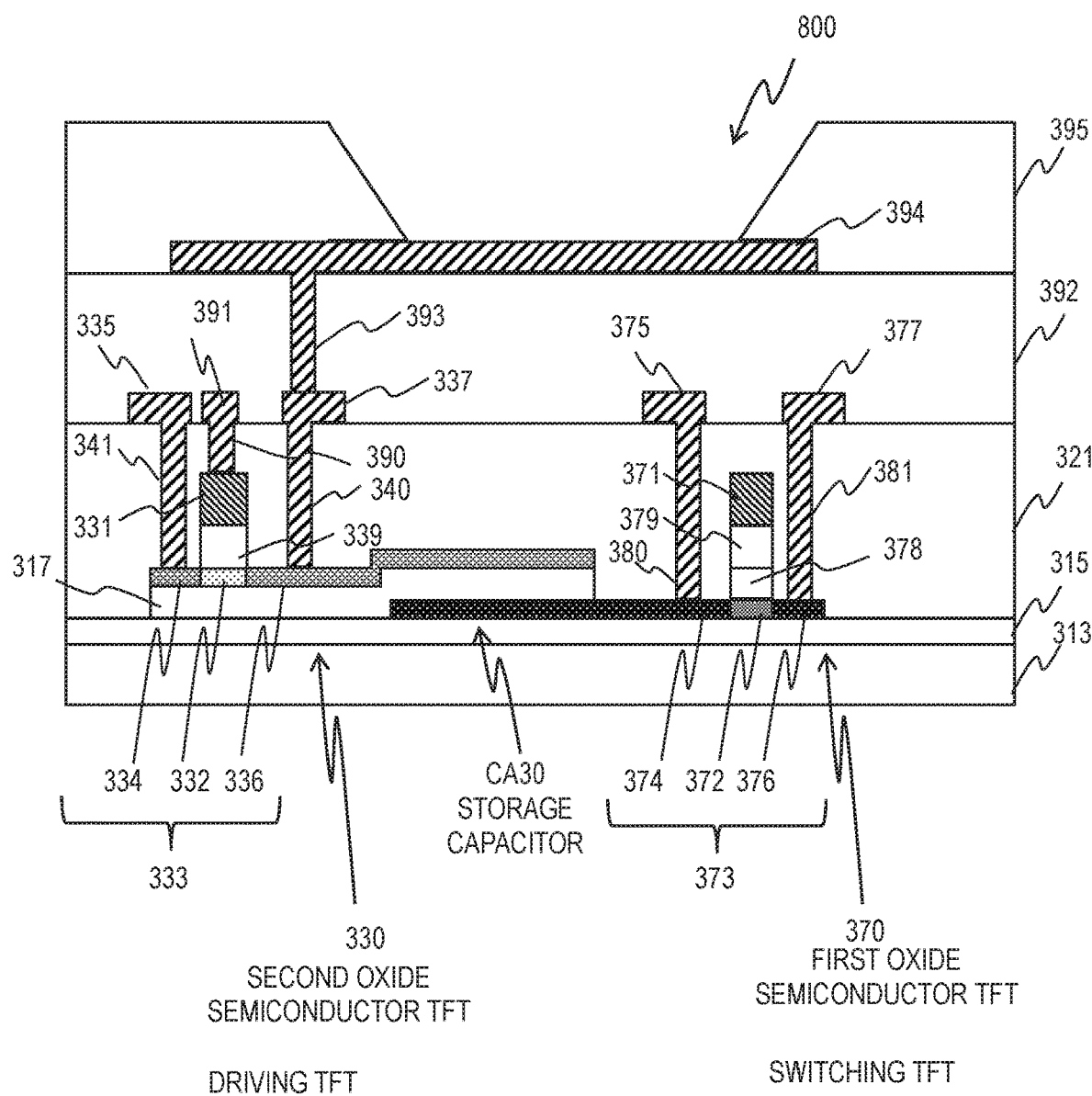
FIG. 17 schematically illustrates a cross-section of a configuration example of a pixel region of a TFT substrate for a top-emission type of OLED display device.

Hereinafter, still another configuration example of a TFT substrate is described. FIG. 17 schematically illustrates a cross-section of a configuration example of a pixel region of a TFT substrate 800 for a top-emission type of OLED display device.

The TFT substrate 800 includes a driving TFT for supplying electric current to an OLED, a storage capacitor CA 30, and a switching TFT for sending a signal to the driving TFT. The switching TFT corresponds to the first oxide semiconductor TFT 370 and the driving TFT corresponds to the second oxide semiconductor TFT 330 in FIG. 17. The first oxide semiconductor TFT 370 and the second oxide semiconductor TFT 330 have the same configurations as the corresponding ones illustrated in FIG. 6.

The capacitor CA 30 is composed of a part of the first oxide semiconductor film 373 formed above the first insulating layer 315, an insulating film 317 that is a part of a second insulating layer formed above the first oxide semiconductor film 373, and a part of a second oxide semiconductor film 333 formed above the insulating film 317. The part of the first oxide semiconductor film 373 included in the capacitor CA 30 is an extension of the source/drain region 374 of the first oxide semiconductor TFT 370. The part of the second oxide semiconductor film 333 included in the capacitor CA 30 is an extension of the source/drain region 336 of the second oxide semiconductor TFT 330.

The insulating film 317 is thinner than the gate insulating film 339 of the second oxide semiconductor TFT 330. As a result, the capacitor CA 30 can have a thin insulating film, compared to the case where a laminate of a lower gate insulating film 378 and an upper gate insulating film 379 is used like the gate insulating film of the first oxide semiconductor TFT 370 or the case where the gate insulating film 339 of the second oxide semiconductor TFT 330 is used and therefore, the capacitor CA 30 can store more electric charges. For this reason, the area of the capacitor CA 30 can be made smaller.

The gate electrode 331 of the second oxide semiconductor TFT 330 is connected with a gate line 391 through a via 390. Although not shown in FIG. 17, the gate line 391 is connected with the source/drain electrode 375 of the first oxide semiconductor TFT 370.

A planarization film 392 is provided over the source/drain electrodes 335, 337, 375, 377, the gate electrode 391, and an interlayer insulating film 321. The planarization film 392 can be formed by applying an organic material having good smoothing property, such as acrylic or polyimide. An anode electrode 394 is provided above the planarization film 392. The anode electrode 394 is connected with the source/drain electrode 337 of the second oxide semiconductor TFT 330 through a via 393 provided in the planarization film 392. The anode electrode 394 can be a laminate of an ITO film and a metal film having high reflectance, such as aluminum or silver. A pixel defining layer 395 is provided above the anode electrode 394. The pixel defining layer 395 can be made of an organic material such as acrylic or polyimide.

A method of manufacturing the TFT substrate 800 illustrated in FIG. 17 can prepare the constituent elements of the first oxide semiconductor TFT 370, the constituent elements of the second oxide semiconductor TFT 330, the constituent elements of the capacitor CA 30, and the interlayer insulating film 321 by following the same steps as illustrated in FIG. 16A to 16I. The following formation of the planarization film 392 and the subsequent processes can be performed by known film formation technique, photolithography technique, and etching technique and therefore, detailed description is omitted here.

As illustrated in FIG. 16D, in forming the second oxide semiconductor film 333, the first oxide semiconductor film 373 is covered with the second insulating layer 318. Accordingly, the first oxide semiconductor film 373 is free from the effect of forming and patterning the second oxide semiconductor film 333. For this reason, desirable oxide semiconductor materials can be employed for the first oxide semiconductor film 373 and the second oxide semiconductor film 333.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A thin-film transistor substrate comprising:
   an insulating substrate;
   a first insulating layer provided on the insulating substrate;
   a first thin-film transistor provided on the insulating substrate and including a first oxide semiconductor film;
   a second insulating layer provided on the insulating substrate and being located upper than the first insulating layer; and
   a second thin-film transistor provided on the insulating substrate and including a second oxide semiconductor film different in composition from the first oxide semiconductor film,
   wherein at least a part of the first oxide semiconductor film is provided above and in contact with the first insulating layer,
   wherein the first insulating layer is the uppermost insulating layer among insulating layers located lower than and in contact with the first oxide semiconductor film,
   wherein at least a part of the second oxide semiconductor film is provided above and in contact with the second insulating layer,
   wherein the second insulating layer is the uppermost insulating layer among insulating layers located lower than and in contact with the second oxide semiconductor film, and
   wherein a channel region of the oxide semiconductor film of either one of the first thin-film transistor and the second thin-film transistor has a wider bandgap than a channel region of the oxide semiconductor film of the other one of the first thin-film transistor and the second thin-film transistor.

2. The thin-film transistor substrate according to claim 1, wherein the channel region of the oxide semiconductor film of the one of the thin-film transistors has a lower mobility than the channel region of the oxide semiconductor film of the other of the thin-film transistors.

3. The thin-film transistor substrate according to claim 1, wherein the entirety of the first oxide semiconductor film is provided above and in contact with the first insulating layer, and
   wherein the entirety of the second oxide semiconductor film is provided above and in contact with the second insulating layer.

4. The thin-film transistor substrate according to claim 1, wherein a part of the first insulating layer is included in a gate insulating film of the first thin-film transistor, and
   wherein a part of the first insulating layer and a part of the second insulating layer are included in a gate insulating film of the second thin-film transistor.

5. The thin-film transistor substrate according to claim 1, wherein a part of the first oxide semiconductor film, a part of the second oxide semiconductor film, and a part of the second insulating layer constitute a capacitor.

6. The thin-film transistor substrate according to claim 1, wherein the thin-film transistor substrate is a component of a display device,
   wherein the first thin-film transistor and the second thin-film transistor are included in a peripheral circuit outside a display region, and
   wherein the channel region of the oxide semiconductor film of the first thin-film transistor has a lower mobility than the channel region of the oxide semiconductor film of the second thin-film transistor.

7. The thin-film transistor substrate according to claim 6, wherein the first thin-film transistor is an electrostatic discharge protection element, and
   wherein the second thin-film transistor is an output driving transistor in a shift register.

8. The thin-film transistor substrate according to claim 1, wherein at least either one of the first oxide semiconductor film and the second oxide semiconductor film include a part of an electrode of a capacitor.

9. The thin-film transistor substrate according to claim 8, wherein the part of the electrode of the capacitor is an extension from the first oxide semiconductor film of the first thin-film transistor.

10. The thin-film transistor substrate according to claim 8, wherein the part of the electrode of the capacitor is an extension from the second oxide semiconductor film of the second thin-film transistor.

11. The thin-film transistor substrate according to claim 1, wherein the thin-film transistor substrate is a component of a display device,
    wherein either one of the first thin-film transistor and the second thin-film transistor is included in a pixel circuit in a display region, and
    wherein the other one of the first thin-film transistor and the second thin-film transistor is included in a peripheral circuit outside the display region.

12. The thin-film transistor substrate according to claim 11,
    wherein the channel region of the oxide semiconductor film of the one of the thin-film transistors has a lower mobility than the channel region of the oxide semiconductor film of the other of the thin-film transistors.

13. The thin-film transistor substrate according to claim 11,
    wherein the one of the thin-film transistors is a switching thin-film transistor, and
    wherein the other of the thin-film transistors is an output driving transistor in a shift register.

14. The thin-film transistor substrate according to claim 11,
    wherein a channel region of the oxide semiconductor film of the one of the thin-film transistors has a higher mobility than a channel region of the oxide semiconductor film of the other of the thin-film transistors,
    wherein the one of the thin-film transistors is a driving thin-film transistor configured to control electric current to a light-emitting element in the pixel circuit, and
    wherein the other of the thin-film transistors is an electrostatic discharge protection element.

15. The thin-film transistor substrate according to claim 11,
wherein a channel region of the oxide semiconductor film of the one of the thin-film transistors has a higher mobility than a channel region of the oxide semiconductor film of the other of the thin-film transistors,
wherein the one of the thin-film transistors is a driving thin-film transistor configured to control electric current to a light-emitting element in the pixel circuit,
wherein the other of the thin-film transistors is included in a shift register,
wherein a power-supply potential is applied to a source/drain of the other of the thin-film transistors, and
wherein output of a previous stage is input to the gate of the other of the thin-film transistors.

16. A method of manufacturing a thin-film transistor substrate, the method comprising:
forming a first insulating layer on an insulating substrate;
forming a first oxide semiconductor layer including a channel region of a first thin-film transistor after forming the first insulating layer;
forming a second insulating layer to cover the first oxide semiconductor layer; and
forming a second oxide semiconductor film including a channel region of a second thin-film transistor in a state where the first oxide semiconductor layer is covered with the second insulating layer,
wherein a channel region of the oxide semiconductor film of either one of the first thin-film transistor and the second thin-film transistor has a wider bandgap than a channel region of the oxide semiconductor film of the other one of the first thin-film transistor and the second thin-film transistor.

17. The method of manufacturing a thin-film transistor substrate according to claim 16,
wherein the channel region of the oxide semiconductor film of the one of the thin-film transistors has a lower mobility than the channel region of the oxide semiconductor film of the other of the thin-film transistors.

* * * * *